(12) United States Patent
Smigelski

(10) Patent No.: US 10,164,609 B2
(45) Date of Patent: Dec. 25, 2018

(54) FRACTIONAL SCALING DIGITAL SIGNAL PROCESSING

(71) Applicant: Wright State University, Dayton, OH (US)

(72) Inventor: Jeffrey R. Smigelski, Dayton, OH (US)

(73) Assignee: Wright State University, Dayton, OH (US)

( * ) Notice: Subject to any disclaimer, the term of this patent is extended or adjusted under 35 U.S.C. 154(b) by 4 days.

(21) Appl. No.: 15/435,847

(22) Filed: Feb. 17, 2017

(65) Prior Publication Data
US 2017/0163246 A1 Jun. 8, 2017

Related U.S. Application Data

(63) Continuation of application No. PCT/US2015/046184, filed on Aug. 20, 2015.
(Continued)

(51) Int. Cl.
*H03H 17/00* (2006.01)
*H03H 17/02* (2006.01)

(52) U.S. Cl.
CPC ........ *H03H 17/0248* (2013.01); *H03H 17/00* (2013.01); *H03H 17/0213* (2013.01);
(Continued)

(58) Field of Classification Search
None
See application file for complete search history.

(56) References Cited

U.S. PATENT DOCUMENTS

| 4,751,663 A | 6/1988 | Yamazaki |
| 4,852,034 A | 7/1989 | Takayama |

(Continued)

FOREIGN PATENT DOCUMENTS

| CN | 103309238 A | 9/2013 |
| CN | 103427789 A | 12/2013 |
| CN | 103558755 A | 2/2014 |

OTHER PUBLICATIONS

Yaary, Michael D.; Notice of Allowance and Fee(s) Due for U.S. Appl. No. 14/469,171, dated Mar. 28, 2017; United States Patent and Trademark Office; Alexandria, VA.
(Continued)

*Primary Examiner* — Michael D. Yaary
(74) *Attorney, Agent, or Firm* — Thomas E. Lees, LLC

(57) ABSTRACT

A digital signal synthesizer for generating a frequency and/or phase modified digital signal output comprises an input buffer, a transform module, a processing module, and an output buffer. The input buffer receives a digital input that is represented in a frequency domain representation. The transform module stores a fractional order control system that models a desired frequency and/or phase response defined by an assembly of at least one filter component. Each filter component is defined by a Laplace function that is modified to include a non-integer control order having a variable fractional scaling exponent. The processing module multiplies or divides the digital input with the fractional order control system stored in the transform module. Moreover, the output buffer stores a synthesized output of the input, which is modified in the frequency domain, the phase domain, or both according to the desired frequency and/or phase response by the processing module.

12 Claims, 13 Drawing Sheets

Related U.S. Application Data

(60) Provisional application No. 62/039,684, filed on Aug. 20, 2014.

(52) U.S. Cl.
CPC ............ *H03H 2017/0072* (2013.01); *H03H 2017/0298* (2013.01)

(56) References Cited

U.S. PATENT DOCUMENTS

| | | |
|---|---|---|
| 4,855,944 A | 8/1989 | Hart |
| 5,262,974 A | 11/1993 | Hausman et al. |
| 5,530,660 A | 6/1996 | Sun et al. |
| 5,592,587 A | 1/1997 | Kunoff et al. |
| 5,864,799 A | 1/1999 | Corretjer et al. |
| 6,272,173 B1 | 8/2001 | Hatamian |
| 6,307,903 B1 | 10/2001 | Harris et al. |
| 6,756,854 B2 | 6/2004 | Stoddard et al. |
| 7,483,931 B2 | 1/2009 | Shimotoyodome |
| 7,599,752 B2 | 10/2009 | Chen |
| 7,626,351 B2 | 12/2009 | Hagihara |
| 7,885,991 B2 | 2/2011 | Behrens et al. |
| 8,223,819 B2 | 7/2012 | Hsieh et al. |
| 2003/0152021 A1 | 8/2003 | Wang et al. |
| 2016/0028239 A1 | 1/2016 | Zhang et al. |

OTHER PUBLICATIONS

Marques, Gabriela; International Search Report and the Written Opinion of the International Searching Authority for PCT Application No. PCT/US2015/046184; dated Oct. 30, 2015; European Patent Office; Rijswijk, Netherlands.

Yaary, Michael D.; Office Action for U.S. Appl. No. 14/469,171; dated Oct. 13, 2016; United States Patent and Trademark Office; Alexandria, VA.

Nickitas-Etienne, Athina; International Preliminary Report on Patentability for PCT Application No. PCT/US2015/046184; dated Mar. 2, 2017; The International Bureau of WIPO; Geneva, Switzerland.

FRACTIONAL SCALING DIGITAL SIGNAL PROCESSING

CROSS REFERENCE TO RELATED APPLICATIONS

This application is a bypass continuation of International Application No. PCT/US2015/046184, filed Aug. 20, 2015, entitled FRACTIONAL SCALING DIGITAL SIGNAL PROCESSING, which claims the benefit of U.S. Provisional Patent Application Ser. No. 62/039,684, filed Aug. 20, 2014, entitled FRACTIONAL SCALING DIGITAL FILTERS AND FRACTIONAL ORDER CONTROL SYSTEMS, the disclosures of which are hereby incorporated herein by reference.

BACKGROUND

The present disclosure relates in general to digital signal processing, and in particular to the construction of signal processing systems that utilize an assembly of filter components, at least one filter component defined by a Laplace function that includes a non-integer control order having a variable fractional scaling exponent.

Numerous signal processing techniques exist to filter or otherwise model a digital representation of a system of interest. However, such signal processing techniques are limited in their ability to accurately filter and reconstruct the system of interest due to artifacts of the processing technique. Artifacts often manifest as ripples, a wide transition bandwidth, slow roll-off, etc. Artifacts can also obscure or alter the relevant signal within the filtered data set resulting in a loss of information from the signal.

BRIEF SUMMARY

According to aspects of the present disclosure, a method for processing a digital signal comprises identifying a desired frequency and/or phase response that is represented in a frequency domain representation, and constructing a fractional order control system that models the desired frequency and/or phase response. The fractional order control system is constructed by assembling at least one filter component from a filter component library, the filter component library comprising an integrator component, a differentiator component, a low-pass filter component, a high pass filter component, a high frequency amplifier component, a low frequency amplifier component, and a resonance filter component. At least one filter component is defined by a Laplace function that includes a non-integer control order having a variable fractional scaling exponent. The method also comprises receiving an input that is in the digital frequency domain, processing the input based upon the fractional order control system to generate a digital output, and conveying the generated digital output signal.

According to further aspects of the present disclosure, a digital signal synthesizer for generating a frequency and/or phase modified digital signal output is provided. The digital signal synthesizer comprises an input buffer, a transform module, a processing module, and an output buffer. The input buffer receives a digital input that is represented in a frequency domain representation, e.g., the Bode space. The transform module stores a fractional order control system that models a desired frequency and/or phase response defined by an assembly of at least one filter component comprising an integrator component, a differentiator component, a low-pass filter component, a high pass filter component, a high frequency amplifier component, a low frequency amplifier component, and a resonance filter component. At least one filter component is defined by a Laplace function that includes a non-integer control order having a variable fractional scaling exponent. The processing module multiplies or divides the digital input with the fractional order control system stored in the transform module. Moreover, the output buffer stores a synthesized output of the input, which is modified in the frequency domain, the phase domain, or both according to the fractional order control system stored in the transform module.

DETAILED DESCRIPTION

Figure 1A:
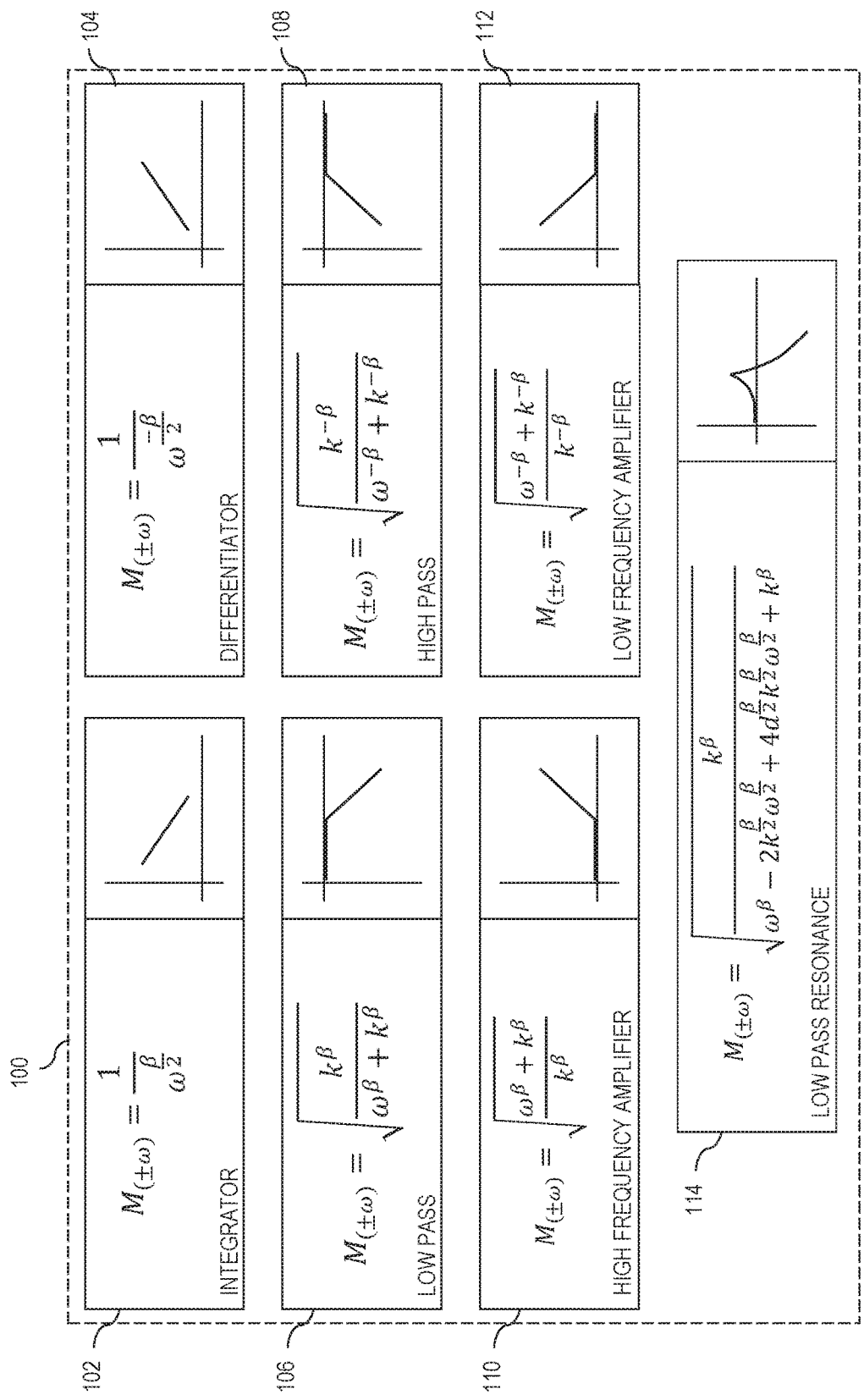
FIG. 1A is a block diagram of a filter component library that includes magnitude-related filter components, where positive frequencies are schematically shown.

Aspects of the present disclosure provide fractional scaling methods, systems, and computer program products that utilize non-integer based fractional calculus to implement fractional filtering (e.g., fractional scaling, fractional phase shifting, fractional integration, fractional differentiation, etc.) to carry out solutions that require processing of digital signals that exist in or can be converted to the frequency domain.

Introduction to the Fractional Scaling Filter Component Library

As will be described in greater detail herein, systems, methods, and computer program products utilize a fractional scaling digital filter bank (i.e., a filter component library) comprised of basic building blocks (referred to herein as fractional scaling digital filter components) that are assembled in various configurations to construct complex signal processing systems. At least one fractional scaling digital filter component incorporates a fractional power scaling exponent, designated herein as $\beta$, into a non-integer control order of a corresponding pre-defined transfer function.

In the below-listed filter component forms, subscripts indicate that the form of the scaling exponent is introduced after the described transfer function is solved for magnitude and phase, and is provided as a convenience to make it relatively more straightforward to solve the associated magnitude and phase equations.

Also, throughout the specification herein, transfer function equations are written in terms of $\beta$ in the positive frequencies of a Complex discrete Fourier transform. $\beta$ represents the negative of the slope when plotted as a power spectrum with power on the axis of the ordinate and frequency on the axis of the abscissa. Thus, the scaling exponent is $\beta/2$ when representing the slope of the magnitude spectrum, which is half the slope of the power spectrum. The transfer functions herein are all in a form of the magnitude spectrum.

A first example building block is an integrator component that has the form $$\frac{1}{s^{\beta/2}},$$

and performs fractional integration of an input signal. Correspondingly, an example differentiator component has the form $$\frac{1}{s^{-\beta/2}},$$

and performs fractional differentiation of the input signal.

An example low-pass filter component has the form $$\left(\frac{k}{s+k}\right)_{\frac{\beta}{2}},$$

which passes low frequencies and attenuates high frequencies. The low-pass filter component can, for convenience, also be written in second order form as $$\left(\frac{k^2}{s^2+2ks+k^2}\right)_{\frac{\beta}{4}}.$$

Likewise, an example high pass filter component has the form $$\left(\frac{k}{s+k}\right)_{\frac{-\beta}{2}},$$

which passes high frequencies and attenuates low frequencies. The corresponding second order high pass filter has the form $$\left(\frac{k^2}{s^2+2ks+k^2}\right)_{\frac{-\beta}{4}}.$$

A high frequency amplifier component has the form $$\left(\frac{s+k}{k}\right)_{\frac{\beta}{2}},$$

which amplifies high frequencies and passes low frequencies. The high frequency amplifier component can, for convenience, also be written in second order form as $$\left(\frac{s^2+2ks+k^2}{k^2}\right)_{\frac{\beta}{4}}.$$

Likewise, a low frequency amplifier component has the form $$\left(\frac{s+k}{k}\right)_{\frac{-\beta}{2}},$$

which amplifies low frequencies and passes high frequencies. The corresponding second order low frequency amplifier component has the form $$\left(\frac{s^2+2ks+k^2}{k^2}\right)_{\frac{-\beta}{4}}.$$

An example resonance filter component has the form $$\left(\frac{k^2}{s^2+2dks+k^2}\right)_{\frac{\beta}{4}}.$$

The resonance filter passes low frequencies and attenuates high frequencies. A damping coefficient 'd' controls resonance peak behavior. The resonance filter can also be modified to derive an "anti-resonance" filter, which is basically the same resonance filter, which is deconvolved with the input. This is accomplished by dividing, instead of multiplying, while in the complex frequency domain. Unique to the present disclosure, the scaling exponent can be tweaked within the resonance equation to allow adjustment of the width at the base of the resonance peak to allow finer tuning. Notably, such capability is not practical with a conventional resonance filter which, is more or less a fixed width with a conventional second order integer based resonance equation. Notably, the scaling exponent may also influence the height of the peak, which may need to be accounted for when designing for a specific application.

Since the fractional scaling digital filters set out more fully herein are reversible, the filter component(s) herein can be used to modify a signal. Then, the modified signal can be converted back to the original signal by deconvolving that signal with the same filter component(s).

In the discussion below, with reference to FIG. 1A, FIG. 1B, FIG. 2A and FIG. 2B, systems are provided based upon fractional scaling Laplace transfer functions where magnitude and phase can be processed independently of one another. However, in practice, for a given fractional scaling Laplace transfer function, magnitude and phase transfer responses are achieved. As such, a designer may select to design based upon the magnitude and phase from the same fractional scaling Laplace transfer function, from magnitude only, from phase only, from a hybrid of magnitude and totally unrelated phase, combinations thereof, etc., to produce desired filtering effects. However, to simulate a system that has both magnitude and phase changes, then one should use the magnitude and corresponding phase from the same fractional scaling Laplace transfer function. Due to the independence of magnitude and phase in systems herein, magnitude is discussed separately from phase.

Introduction to Magnitude Related Fractional Scaling Filter Components

Referring now to the drawings, and in particular to FIG. 1A, a filter component library 100 includes filter components that are expressed in terms of magnitude that is completely independent of phase. The filter component library 100 in practice, can have as few or as many filter components as the particular application dictates. However, for sake of clarity of discussion, the illustrative filter component library 100 includes one or more (in any combination) of the below-identified seven filter components.

A first example magnitude-based filter component is an integrator component 102 that is expressed in terms of magnitude $$M_{(\pm\omega)} = \frac{1}{\omega^{\frac{\beta}{2}}},$$

which represents a function that has a negative slope when plotted according to positive frequencies in Bode space. A second example magnitude-based filter component is a differentiator component 104 that is expressed in terms of magnitude $$M_{(\pm\omega)} = \frac{1}{\omega^{\frac{-\beta}{2}}},$$

which represents a function that has a positive slope when plotted according to positive frequencies in Bode space.

A third example magnitude-based filter component is a low-pass filter component 106 that is expressed in terms of magnitude $$M_{(\pm\omega)} = \sqrt{\frac{k^\beta}{\omega^\beta + k^\beta}}.$$

The low-pass filter component 106 represents a low-pass function that passes low frequencies in a defined passband and attenuates high frequencies in an attenuation band when plotted according to positive frequencies in Bode space. A fourth example magnitude-based filter component is a high pass filter component 108 that is expressed in terms of magnitude $$M_{(\pm\omega)} = \sqrt{\frac{k^{-\beta}}{\omega^{-\beta} + k^{-\beta}}}.$$

The high pass filter component 108 represents a high pass function that passes high frequencies in a defined passband and attenuates low frequencies in an attenuation band when plotted according to positive frequencies in Bode space.

A fifth example magnitude-based filter component is a high frequency amplifier component 110 that is expressed in terms of magnitude $$M_{(\pm\omega)} = \sqrt{\frac{\omega^\beta + k^\beta}{k^\beta}}.$$

Like the low-pass filter component 106, the high frequency amplifier component 110 passes low frequencies. However, the high frequency amplifier component 110 amplifies high frequencies (compared to the attenuation of high frequencies exhibited by the low-pass filter component 106), when plotted according to positive frequencies in Bode space. Likewise, a sixth example magnitude-based filter component is a low frequency amplifier component 112 that is expressed in terms of magnitude $$M_{(\pm\omega)} = \sqrt{\frac{\omega^{-\beta} + k^{-\beta}}{k^{-\beta}}}.$$

The low frequency amplifier component 112 passes high frequencies. However, the low frequency amplifier component 112 amplifies low frequencies (compared to the attenuation of low frequencies exhibited by the high pass filter component 108), when plotted according to positive frequencies in Bode space.

A seventh example magnitude-based filter component is a resonance filter component 114 that is defined in terms of magnitude $$M_{(\pm\omega)} = \sqrt{\frac{k^\beta}{\omega^\beta - 2k^{\frac{\beta}{2}}\omega^{\frac{\beta}{2}} + 4d^{\frac{\beta}{2}}k^{\frac{\beta}{2}}\omega^{\frac{\beta}{2}} + k^\beta}},$$

when plotted according to positive frequencies in Bode space. The resonance filter component 114 passes low frequencies, and attenuates high frequencies, much like the low-pass filter component 106. However, the resonance filter component 114 exhibits a resonant peak at the transition from the passband to the attenuation band. A height of the resonance peak is influenced by the damping coefficient d.

Figure 1B:
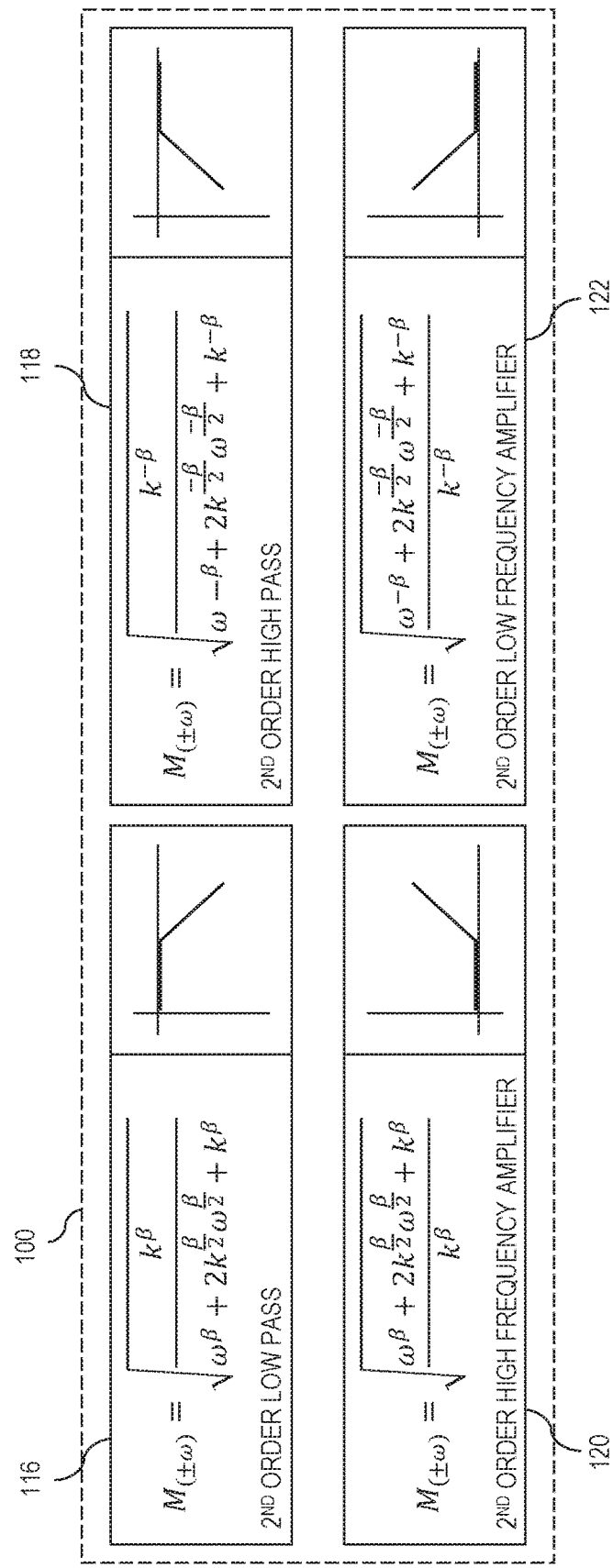
FIG. 1B is an extension of the library of FIG. 1A, to include second order magnitude-related filter components where positive frequencies are schematically shown.

Referring to FIG. 1B, it may be convenient to extend the filter component library 100 to include higher order functions. For instance, the illustrative filter component library is extended to include an example eighth magnitude-based filter component implemented as a second order low-pass filter component 116 expressed in terms of magnitude $$M_{(\pm\omega)} = \sqrt{\frac{k^\beta}{\omega^\beta + 2k^{\frac{\beta}{2}}\omega^{\frac{\beta}{2}} + k^\beta}},$$

when plotted according to positive frequencies in Bode space. Likewise, a ninth example magnitude-based filter component is implemented as a second order high pass filter component 118 expressed in terms of magnitude $$M_{(\pm\omega)} = \sqrt{\frac{k^{-\beta}}{\omega^{-\beta} + 2k^{\frac{-\beta}{2}}\omega^{\frac{-\beta}{2}} + k^{-\beta}}},$$

when plotted according to positive frequencies in Bode space.

Moreover, a tenth example magnitude-based filter component is implemented as a second order high frequency amplifier filter component 120 expressed in terms of magnitude $$M_{(\pm\omega)} = \sqrt{\frac{\omega^\beta + 2k^{\frac{\beta}{2}}\omega^{\frac{\beta}{2}} + k^\beta}{k^\beta}},$$

when plotted according to positive frequencies in Bode space. Analogously, an example eleventh magnitude-based filter component is implemented as a second order low frequency amplifier component 122 expressed in terms of magnitude $$M_{(\pm\omega)} = \sqrt{\frac{\omega^{-\beta} + 2k^{\frac{-\beta}{2}}\omega^{\frac{-\beta}{2}} + k^{-\beta}}{k^{-\beta}}},$$

when plotted according to positive frequencies in Bode space.

In practice, the filter component library 100 can include one or more of the filter components 102-122 illustrated in FIG. 1A-FIG. 1B. Additionally, other filter component forms (i.e., filter functions derived from Laplace equations) may be implemented in the filter component library 100 by substituting β/2 as the control order for a Laplace transfer function.

The filter components are defined by a transfer function having a response that extends the entire range of both positive and negative frequencies in a corresponding frequency domain representation, e.g., Bode space. In this regard, it is through the interaction of a combination of filter components, each covering the entire frequency spectrum, that a desired frequency response is derived.

Introduction to Phase Derived Fractional Scaling Filter Components

Figure 2A:
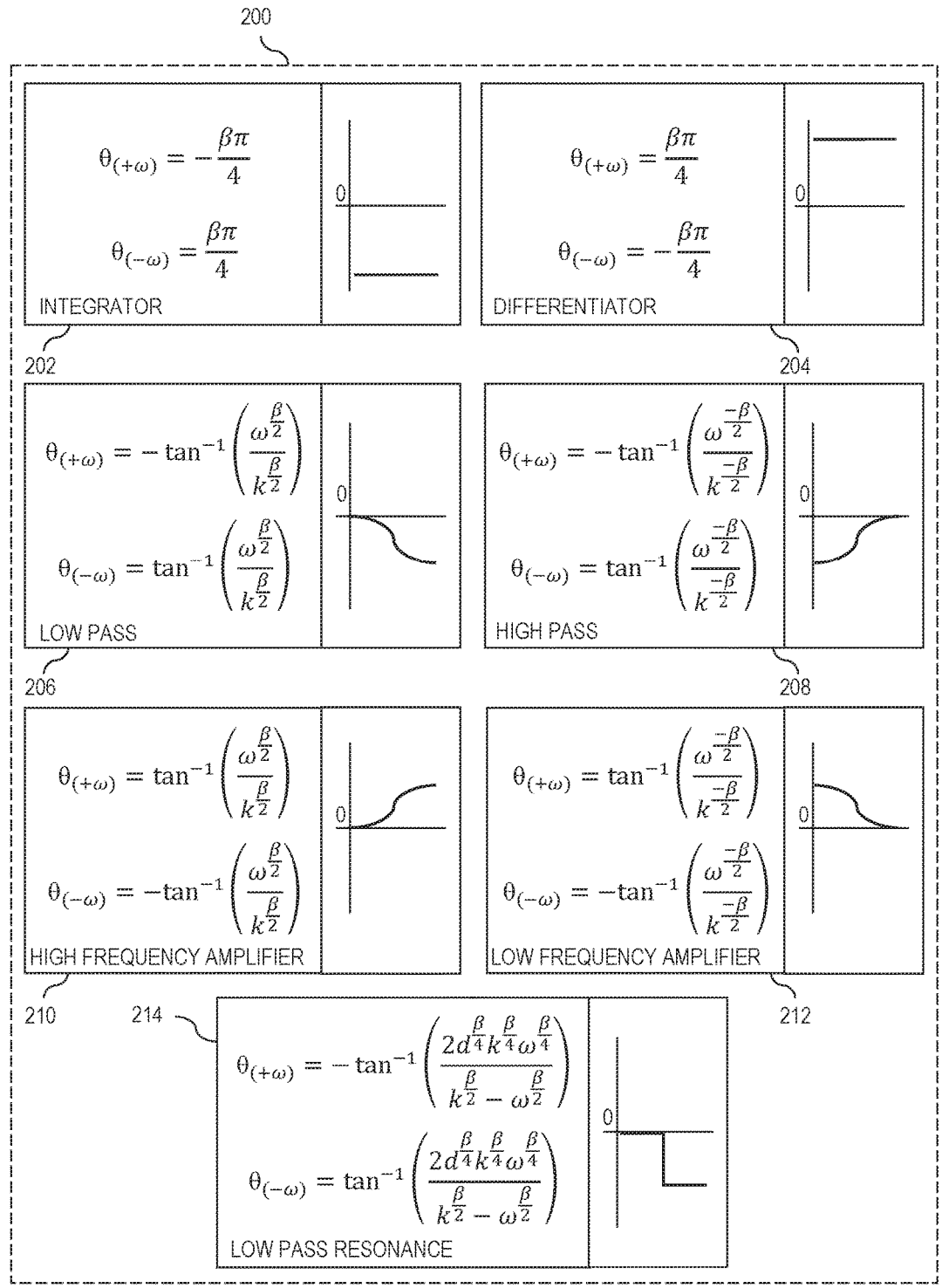
FIG. 2A is a block diagram of a filter component library that includes phase-related filter components, where positive frequencies are schematically shown.

Referring to FIG. 2A, a filter component library 200 includes filter components that are expressed in terms of phase that is independent of magnitude. The filter component library 200 in practice, can have as few or as many filter components as the particular application dictates. However, for sake of clarity of discussion, the illustrative filter component library 200 includes one or more (in any combination) of the below-identified seven phase-related filter components.

A first example phase-related filter component is an integrator component 202 that is expressed in terms of phase as $$\theta_{(+\omega)} = -\frac{\beta\pi}{4}, \theta_{(-\omega)} = \frac{\beta\pi}{4}.$$

Notably, the phase does not vary in the positive Bode space. However, the phase is shifted −90 degrees across the entirety of the positive frequencies for an example implementation where β=2. Analogously, a second example phase-related filter component is the differentiator component 204 that is expressed in terms of phase as $$\theta_{(+\omega)} = \frac{\beta\pi}{4}, \theta_{(-\omega)} = -\frac{\beta\pi}{4}.$$

Similar to the integrator component 202, the phase does not vary in the positive Bode space. However, the phase is shifted +90 degrees across the entirety of the positive frequencies for an example implementation where β=2.

A third example phase-related filter component is a low-pass filter component 206 that is defined in terms of phase as $$\theta_{(+\omega)} = -\tan^{-1}\left(\frac{\omega^{\frac{\beta}{2}}}{k^{\frac{\beta}{2}}}\right), \theta_{(-\omega)} = \tan^{-1}\left(\frac{\omega^{\frac{\beta}{2}}}{k^{\frac{\beta}{2}}}\right).$$

In practice, the phase shift is 0 at the endpoint low frequency, and transitions to a frequency of −90 degrees at the endpoint high frequency as the frequency increases. In an example implementation of β=2 and k=0.01, the phase passes through −45 degrees at a gain of k=0.01. Analogously, an fourth example phase-related filter component is a high pass filter component 208 that is expressed in terms of phase as $$\theta_{(+\omega)} = -\tan^{-1}\left(\frac{\omega^{\frac{-\beta}{2}}}{k^{\frac{-\beta}{2}}}\right), \theta_{(-\omega)} = \tan^{-1}\left(\frac{\omega^{\frac{-\beta}{2}}}{k^{\frac{-\beta}{2}}}\right).$$

In practice, the phase shift is 0 at the endpoint high frequency, and transitions to −90 degrees at the endpoint low frequency as the frequency decreases. In an example implementation of β=2 and k=0.01, the phase passes through −45 degrees at a gain of k=0.01.

A fifth example phase-related filter component is a high frequency amplifier component 210 that is defined in terms of phase as $$\theta_{(+\omega)} = \tan^{-1}\left(\frac{\omega^{\frac{\beta}{2}}}{k^{\frac{\beta}{2}}}\right), \theta_{(-\omega)} = -\tan^{-1}\left(\frac{\omega^{\frac{\beta}{2}}}{k^{\frac{\beta}{2}}}\right).$$

In practice, the phase shift is 0 at the endpoint low frequency, and transitions to a frequency of +90 degrees at the endpoint high frequency as the frequency increases. In an example implementation of β=2 and k=0.01, the phase passes through 45 degrees at a gain of k=0.01. Analogously, a sixth example phase-related filter component is a low frequency amplifier filter component 212, which is expressed in terms of phase as $$\theta_{(+\omega)} = \tan^{-1}\left(\frac{\omega^{\frac{-\beta}{2}}}{k^{\frac{-\beta}{2}}}\right), \theta_{(-\omega)} = -\tan^{-1}\left(\frac{\omega^{\frac{-\beta}{2}}}{k^{\frac{-\beta}{2}}}\right).$$

In practice, the phase shift is +90 at the endpoint low frequency, and transitions to 0 degrees at the endpoint high frequency as the frequency decreases. In an example implementation of β=2 and k=0.01, the phase passes through 45 degrees at a gain of k=0.01.

A seventh example phase-related filter component is a resonance filter component 214 that is expressed in terms of phase as $$\theta_{(+\omega)} = -\tan^{-1}\left(\frac{2d^{\frac{\beta}{4}}k^{\frac{\beta}{4}}\omega^{\frac{\beta}{4}}}{k^{\frac{\beta}{2}} - \omega^{\frac{\beta}{2}}}\right), \theta_{(-\omega)} = \tan^{-1}\left(\frac{2d^{\frac{\beta}{4}}k^{\frac{\beta}{4}}\omega^{\frac{\beta}{4}}}{k^{\frac{\beta}{2}} - \omega^{\frac{\beta}{2}}}\right).$$

The phase response of the resonance filter component 214 is 0 degrees for low frequencies, and steps down to −180 degrees at the transition from the passband to the stop band. In an example implementation of β=2 and k=0.01, the phase passes through −90 degrees at a gain of k=0.01.

Figure 2B:
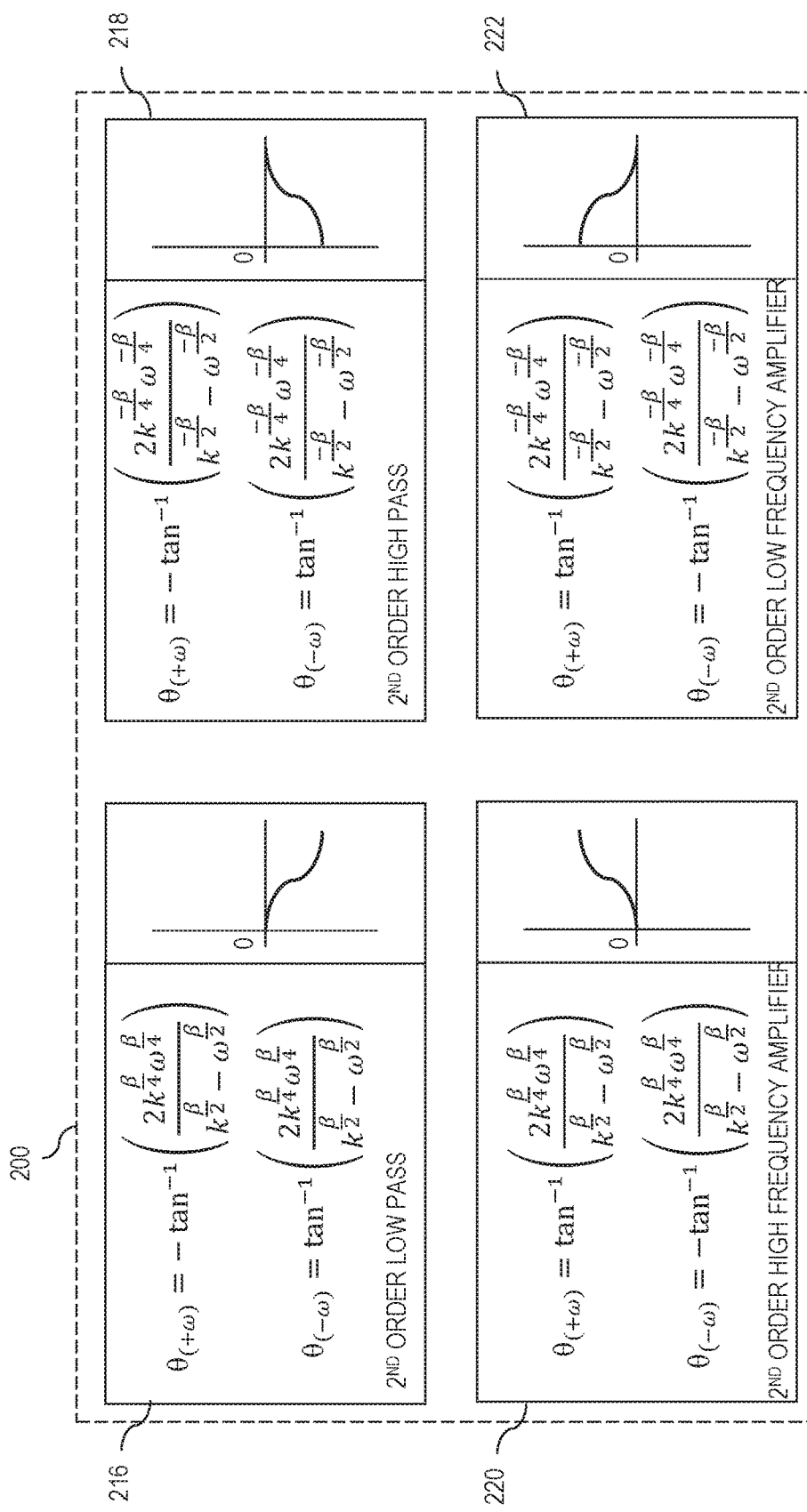
FIG. 2B is an extension of the library of FIG. 2A, to include second order phase-related filter components, where positive frequencies are schematically shown.

With reference to FIG. 2B, as with the magnitude components, it may be convenient to extend the filter component library 200 to include higher order functions.

For instance, the illustrative filter component library 200 is extended to include an eighth example phase-based filter component implemented as a second order low-pass filter component 216 that is expressed in terms of phase as $$\theta_{(+\omega)} = -\tan^{-1}\left(\frac{2k^{\frac{\beta}{4}}\omega^{\frac{\beta}{4}}}{k^{\frac{\beta}{2}} - \omega^{\frac{\beta}{2}}}\right), \theta_{(-\omega)} = \tan^{-1}\left(\frac{2k^{\frac{\beta}{4}}\omega^{\frac{\beta}{4}}}{k^{\frac{\beta}{2}} - \omega^{\frac{\beta}{2}}}\right).$$

In practice, the phase shift is 0 at the endpoint low frequency, and transitions to a frequency of −180 degrees at the endpoint high frequency as the frequency increases. In an example implementation of β=2 and k=0.01, the phase passes through −90 degrees at a gain of k=0.01.

A ninth example phase-related filter component is phase-based filter component implemented as a second order high pass filter component 218 that is expressed in terms of phase as $$\theta_{(+\omega)} = -\tan^{-1}\left(\frac{2k^{\frac{-\beta}{4}}\omega^{\frac{-\beta}{4}}}{k^{\frac{-\beta}{2}} - \omega^{\frac{-\beta}{2}}}\right), \theta_{(-\omega)} = \tan^{-1}\left(\frac{2k^{\frac{-\beta}{4}}\omega^{\frac{-\beta}{4}}}{k^{\frac{-\beta}{2}} - \omega^{\frac{-\beta}{2}}}\right).$$

In practice, the phase shift is 0 at the endpoint high frequency, and transitions to −180 degrees at the endpoint low frequency as the frequency decreases. In an example implementation of β=2 and k=0.01, the phase passes through −90 degrees at a gain of k=0.01.

A tenth example phase-related filter component is implemented as a second order high frequency amplifier component 220 that is expressed in terms of phase as $$\theta_{(+\omega)} = \tan^{-1}\left(\frac{2k^{\frac{\beta}{4}}\omega^{\frac{\beta}{4}}}{k^{\frac{\beta}{2}} - \omega^{\frac{\beta}{2}}}\right), \theta_{(-\omega)} = -\tan^{-1}\left(\frac{2k^{\frac{\beta}{4}}\omega^{\frac{\beta}{4}}}{k^{\frac{\beta}{2}} - \omega^{\frac{\beta}{2}}}\right).$$

In practice, the phase shift is 0 at the endpoint low frequency, and transitions to a frequency of +180 degrees at the endpoint high frequency as the frequency increases. In an example implementation of β=2 and k=0.01, the phase passes through 90 degrees at a gain of k=0.01. Analogously, an example eleventh phase-related filter component is implemented as a second order low frequency amplifier component 222 that is expressed in terms of phase as $$\theta_{(+\omega)} = \tan^{-1}\left(\frac{2k^{\frac{-\beta}{4}}\omega^{\frac{-\beta}{4}}}{k^{\frac{-\beta}{2}} - \omega^{\frac{-\beta}{2}}}\right), \theta_{(-\omega)} = -\tan^{-1}\left(\frac{2k^{\frac{-\beta}{4}}\omega^{\frac{-\beta}{4}}}{k^{\frac{-\beta}{2}} - \omega^{\frac{-\beta}{2}}}\right).$$

In practice, the phase shift is +180 at the endpoint low frequency, and transitions to 0 degrees at the endpoint high frequency as the frequency increases. In an example implementation of β=2 and k=0.01, the phase passes through 90 degrees at a gain of k=0.01.

In practice, the filter component library 200 can include one or more of the filter components 202-222 illustrated in FIG. 2A-FIG. 2B. Additionally, other filter component forms (i.e., filter functions derived from Laplace equations) may be implemented in the filter component library 200 by substituting β/2 as the control order for a Laplace transfer function.

The filter components are defined by a transfer function having a response that extends the entire range of both positive and negative frequencies in a corresponding frequency domain representation, e.g., Bode space. In this regard, it is through the interaction of a combination of filter components, each covering the entire frequency spectrum, that a desired phase response is derived.

With reference to FIG. 1A, FIG. 1B, FIG. 2A, and FIG. 2B collectively, in the schematic representations of the filter functions shown for each of the filter components 102-122 of FIG. 1A-FIG. 1B, and correspondingly filter components 202-222 of FIG. 2A-FIG. 2B, only positive frequencies are shown.

In practice, the filter component library 100 illustrated in FIG. 1A-FIG. 1B and the filter component library 200 illustrated in FIG. 2A-FIG. 2B can be implemented as two or more separate libraries, e.g., one library for magnitude and a separate library for phase. Alternatively, the filter component library 100 illustrated in FIG. 1A-FIG. 1B and the filter component library 200 illustrated in FIG. 2A-FIG. 2B can be integrated into a single component library.

Moreover, any of the filter components described above, e.g., in FIG. 1A, FIG. 1B, FIG. 2A, and FIG. 2B can be scaled by a scaling factor K. The scaling factor K can be used to shift a response up or down in magnitude on the spectrum. The scaling factor K is thus a multiplier applied to the entire filter. The scaling factor K is useful, for example, for adjusting the filter to align properly with an incoming signal. As another example, the scaling factor K can be utilized to make a passband an amplifying band at the same time.

The filter library 100, 200 (or a combination thereof as separate libraries or combined into a single library) can be integrated into a digital signal processing chip (e.g., FPGA, ASIC, etc.). As another example, filter library 100, 200 (or a combination thereof as separate libraries or combined into a single library) can be implemented as function libraries in a computer platform, e.g., in a discrete device such as an embedded system running a Linux processor, on a desktop computer, or in any other environment where it is desirable to implement digital signal processing.

Method of Processing a Digital Signal

Figure 3:
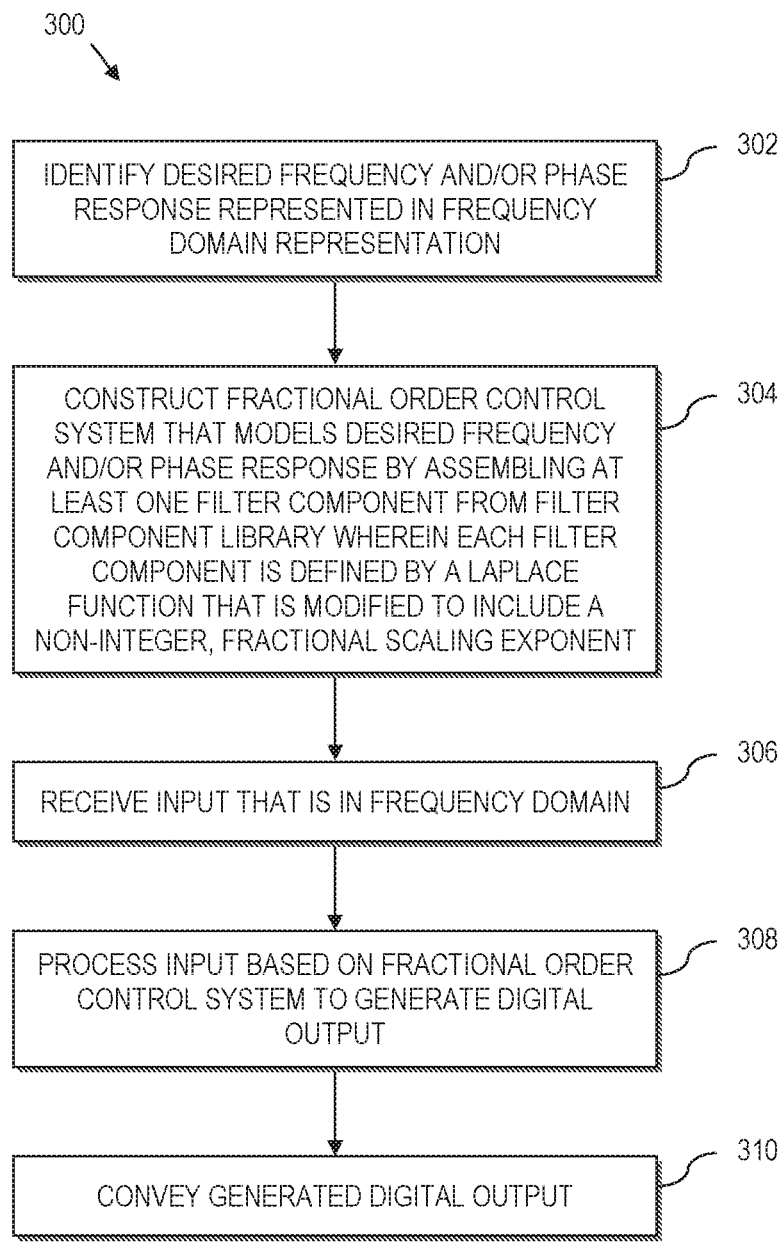
FIG. 3 is a flow chart illustrating a method of processing a digital signal using at least one filter component defined by a Laplace function that includes a non-integer control order having a variable fractional scaling exponent.

Referring to FIG. 3, a method 300 is provided, for processing a digital signal. The method comprises identifying, at 302, a desired frequency and/or phase response that is represented in a frequency domain representation. In an illustrative implementation, the frequency domain representation is the Bode space.

The method also comprises constructing, at 304, a fractional order control system that models the desired frequency and/or phase response by assembling at least one filter component from a filter component library. As described in greater detail herein with regard to FIGS. 1A-FIG. 2B, the filter component library (or libraries) can include at least one of an integrator component, a differentiator component, a low-pass filter component, a high pass filter component, a high frequency amplifier component, a low frequency amplifier component, and a resonance filter component. Unlike conventional filter components, each filter component is defined by a Laplace function that is modified to include a non-integer control order having a variable fractional scaling exponent β.

Notably, the fractional scaling exponent β can be an integer value as well as a non-integer value. However, the control order is defined as β/2, thus enabling one or more filter components to have a control order that is not an integer value. In this regard, the scaling exponent (from a linear-least squared fit to the power spectrum) modifies the corresponding Laplace function, examples of which are provided in equation form in the discussion with regard to FIG. 1A-FIG. 2B.

As will be described in greater detail herein, constructing a fractional order control system can be implemented by working step-wise in a single direction across the range of frequencies in the frequency domain representation (e.g., working from the lowest frequency step-wise to the highest frequency), and for each change in the desired frequency and/or phase response, fitting at least one associated filter component from the filter component library to match the corresponding change in the desired frequency and/or phase response.

The method 300 may further comprise defining each one of the filter components in the filter component library to have a response that extends the entire range of frequencies in the frequency domain representation. In this regard, working step-wise in a single direction across the range of frequencies in the frequency domain representation further comprises selecting, for each change in the desired frequency and/or phase response, at least one filter component from the filter component library, such that the sum of the responses of all filter components constructed into the fractional order control system follow the changes across the frequency spectrum of the desired frequency and/or phase response.

More particularly, the magnitude (if any) and phase (if any) of the fractional order control system are converted from polar notation to rectangular notation as complex numbers in both positive and negative frequencies to transform the FFT of the input signal (also in rectangular notation) to yield a new set of complex numbers which represents the rectangular notation of the filtered output which is then converted to the time domain via an IFFT to yield the filtered output signal.

Yet further, constructing a fractional order control system may comprise constructing a fractional scaling digital filter to filter select frequencies of the input such that filtering comprises magnitude and phase modification of the input, where the magnitude modification utilizes at least one filter component that is different from that used for phase modification. This represents a "hybrid" filtering system. For instance, an example implementation of the method 300, the fractional order control system can include a low-pass filter to reduce the amplitudes of the high frequencies and then also apply a simple integrator filter in phase only to introduce a −90 degree phase shift across all positive frequencies resulting in a hybrid filter that effectively phase shifts the passband while attenuating (and phase shifting) the stopband. Here, the integrator phase filter component operates on the phase without any contribution from the phase-related low-pass filter component (no low-pass filter induced phase contribution), despite the magnitude-related low-pass filter component altering the magnitude of the output. Likewise, there is no contribution of the magnitude-related integrator, despite the phase-related integrator shifting the signal in phase.

Thus, for instance, this allows the implementation of two or more normally distinct filtering steps in one single filter step. Moreover, the different magnitude and phase filter components can be in the same calculation upon combining magnitude and phase when converting to rectangular notation from polar notation. Thus, information from the two distinct filtering steps is summarized in a single array of complex numbers of the filter.

As a few additional examples, a fractional scaling digital filter can be constructed to filter select frequencies of the input such that filtering comprises magnitude-only frequency modifications, with a select one of no phase distortion and linear phase. Likewise, a fractional scaling digital filter can be constructed to filter that comprises phase-only frequency modifications on the input.

The method 300 comprises receiving at 306, an input that is in the digital frequency domain. Also, the method 300 comprises processing at 308, the input based upon the fractional order control system to generate a digital output. Yet further, the method 300 comprises conveying at 310, the generated digital output signal. The conveyance of the signal may comprise communicating the output to a register, port, buffer, etc., writing to a file, transmitting the output across a bus, network or other interface, or taking any other desired action to position the output so as to be useful to a downstream application, circuitry, etc.

As will be described in greater detail herein, the method 300 may also comprise receiving at least one parameter that is actively monitored to control a modification to the fractional order control system resulting in a change in at least one of the fractional scaling and phase shifting of the frequency content of the input.

In yet another illustrative example, the method 300 is extended such that the input is a select one of a digital image and video. In this implementation, the desired frequency and/or phase response is selected to implement a predetermined image and/or video processing function.

In still another example implementation of the method 300, the input is a natural stochastic time series and the desired frequency and/or phase response is selected to cause the output to conform to a statistically identical synthetic model of the natural stochastic time series (e.g., for simulation and modeling in computers, scientific simulations, video games, special effects in movies, etc.)

In still another example, the method 300 is extended such that the input is an analog signal that is converted to the digital frequency domain, and the desired frequency and/or phase response is selected to cause the output to represent a frequency filtered version of the input.

In certain implementations of the method 300, it is possible that the phase computations (e.g., when assembling multiple phase-related filter components) will yield the correct phase of the positive frequencies $\theta_{(+\omega)}$. However, such computations may yield incorrect signs or values in the negative frequencies if used to calculate phase for both positive and negative frequencies. Since phase exhibits odd symmetry behavior, phase of the negative frequencies may be entirely calculated from the phase of the positive frequencies.

In practice, filter components are aggregated together to produce a final fractional order control system that is independent of the number of filter components used to construct the fractional order control system. That is, the overall size of the fractional order control system is unchanged whether a single filter component or numerous filter components are utilized. By way of example, for a signal and filter of length N=8192, in an implementation as set out herein, it does not matter whether one filter component or ten filter components are utilized to construct the fractional order control system. The system resolves to 8192 complex numbers to multiply by the signal to obtain the correct result. This is in strong distinction from conventional filter cascades (or taps) where more filter components mean more processing time.

Thus for instance, chips can be manufactured with a set of common filters at specific gain values and rates of attenuation by implementing the fractional order control system as a set of complex numbers representing the assembly of filter components. Here, the processing merely needs to multiply (or divide in the case of deconvolution) the input by the set of complex numbers defined by the fractional order control system. This approach can potentially significantly speed up filtering since the process calculates the endpoint directly through the rotation and amplification/attenuation of the complex numbers around the unit circle.

Figure 4:
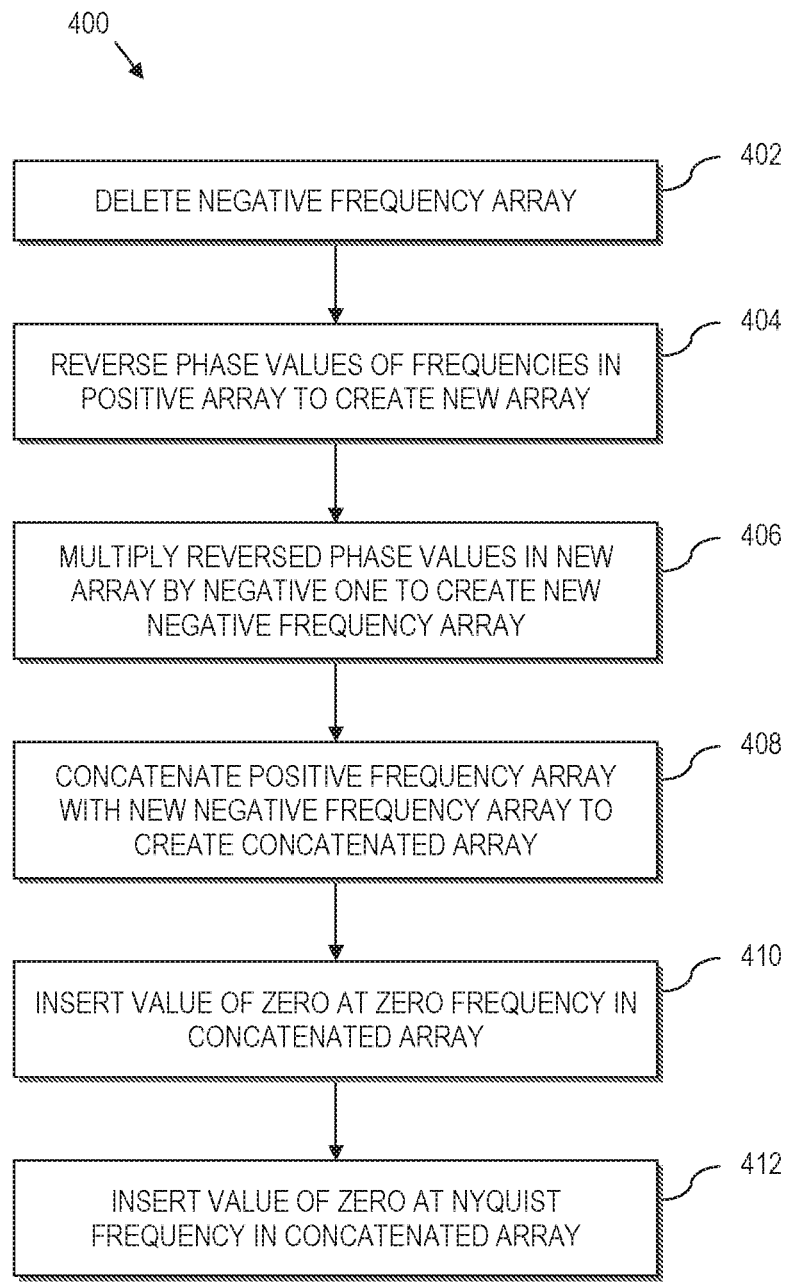
FIG. 4 is a flow chart illustrating a method of correcting phase in cooperation with the method of FIG. 3.

Referring to FIG. 4, one method 400 to calculate the phase of the negative frequencies $\theta_{(-\omega)}$ comprises deleting at 402, negative frequencies. For instance, where positive and negative frequencies are stored in a frequency array, the method deletes negative frequencies from the frequency array. The method 400 also comprises reversing at 404, the phase values of the positive frequencies. For instance, in an example implementation, phase information may be stored in two arrays, including a positive phase array $\theta_{(+w)}$ and a negative phase array $\theta_{(-\omega)}$. The method 400 makes a copy of positive phase values (e.g., from the positive phase array $\theta_{(+\omega)}$), then reverses the order of the elements of the array to create new values at corresponding negative frequencies. An illustrative approach is to flip a phase array $\theta_{(+\omega)}$ from left to right. The new phase values can be inserted into the existing array (e.g., overwrite the values of the negative phase array $\theta_{(-\omega)}$), or a new array can be created, such as negative phase array $\theta_{(-\omega)II}$.

The method 400 also comprises multiplying at 406, the new negative frequency values by negative one (i.e., multiply by −1) For instance, the values in the negative phase array $\theta_{(-\omega)II}$ are each multiplied by −1. Multiplying by −1 recovers odd symmetry behavior of phase.

The method 400 then comprises concatenating at 408, the positive frequency values with the newly computed negative frequency values. The method 400 still further comprises inserting, at 410, a phase of θ=0 at a frequency of zero (e.g., an index of a corresponding array which only contains a cosine (x) component in the complex number x+jy). The method 400 also comprises inserting, at 412, a phase of θ=0 at the Nyquist frequency ($\omega_c=\pi$). In this regard, a new phase array may be created that exhibits the odd symmetry behavior of phase across positive and negative frequencies.

Digital Synthesizer Example

Figure 5:
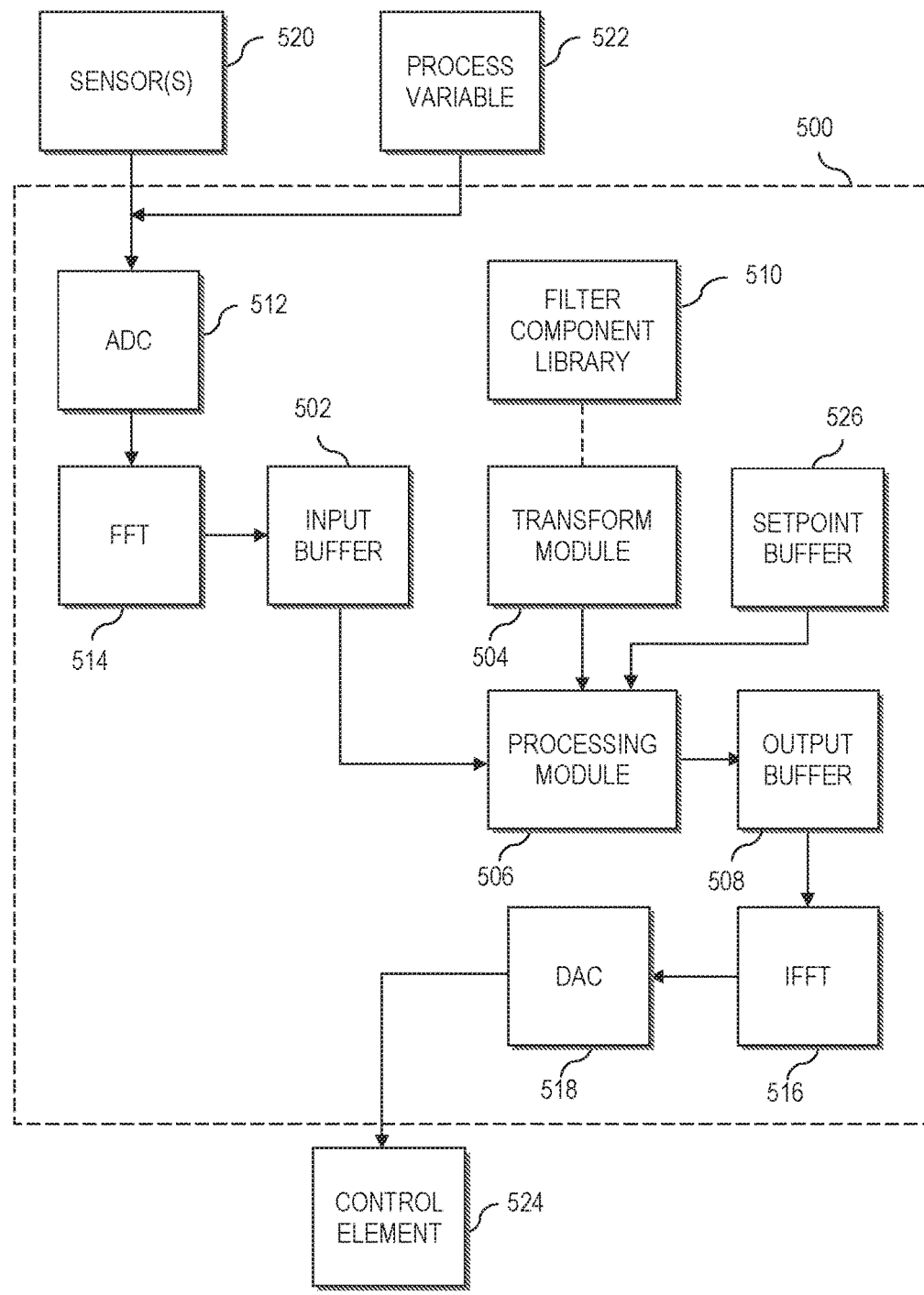
FIG. 5 is a block diagram illustrating a digital signal synthesizer using one or more of the features set out in regard to FIG. 1-FIG. 4.

Referring to FIG. 5, a digital signal synthesizer 500 is provided, for generating a frequency and/or phase modified digital signal output. Here, the term "digital signal synthesizer" is indicative of the observation that a main processor processes some input based upon some fractional order control system. In this regard, the digital signal synthesizer 500 can be utilized to receive as an input, a natural stochastic time series, where fractional order control system describes a desired frequency and/or phase response to cause the output to conform to a statistically identical synthetic model of the natural stochastic time series.

In yet another illustrative example, the digital signal synthesizer 500 can function as a controller by processing and conditioning sensor inputs. In this regard, one specific example use of the digital signal synthesizer 500 is as a fractional order proportional-integral-derivative (PID) controller. Yet further, the digital signal synthesizer 500 can function as a signal generator and/or effect processor, by applying various frequency magnitude and phase manipulations, e.g., to implement a musical tone generator, musical synthesizer, to generate standardized noise, for testing audio systems, performing various input data analysis, for performing encoding/decoding operations, etc. Still further, because the parameters of the fractional order control system are β, k, and an optional scaling factor K, the fractional order control system can be adaptive, dynamic or otherwise modifiable, making the digital signal synthesizer 500 suitable for adaptive, dynamic applications. Yet further, the digital signal synthesizer 500 can be used to establish a resonant peak, to identify and filter out an inherent resonant peak in an existing signal, etc.

The digital signal synthesizer comprises in general, an input buffer 502, a transform module 504, a processing module 506, and an output buffer 508. The input buffer 502 receives a digital input that is represented in a frequency domain representation, e.g., in the Bode space.

The transform module 504 stores a fractional order control system that models a desired frequency and/or phase response defined by an assembly of at least one filter component comprising, an integrator component, a differentiator component, a low-pass filter component, a high pass filter component, a high frequency amplifier component, a low frequency amplifier component, and a resonance filter component. By way of example, the filter components of the transform module 504 may be any combination of one or more of the filter components described more fully herein with regard to FIG. 1A-FIG. 2B (i.e., FIG. 1A, FIG. 1B, FIG. 2A, and FIG. 2B). More specifically, each filter component is defined by a Laplace function that is modified to include a non-integer control order having a variable fractional scaling exponent. Here, the fractional order control system can be in the form of complex variables, such as where the filter design has already been worked out and has been reduced down to the necessary complex component values. In other implementations, the fractional order control system can include the equations, components of the equations, etc., as necessary to carry out the filtering functions defined thereby.

The processing module 506 receives the input from the input buffer 502 and the fractional order control system stored in the transform module 504, and multiplies the digital input with the fractional order control system. Moreover, the processing module 506 can optionally carry out one or more of the methods (or portions thereof) as set out for instance, with regard to FIG. 3 and FIG. 4 herein. The processing module 506 conveys the processed signal to the output buffer 508.

The output buffer 508 thus stores a synthesized output of the input, which is modified in the frequency domain, the phase domain, or both according to the desired frequency and/or phase response (defined by the fractional order control system stored in the transform module 504) by the processing module 506.

In example implementations where the fractional order control system stored in the transform module 504 is dynamic or otherwise modifiable, the digital signal synthesizer 500 can include a library (or libraries) of filter components 510, e.g., the filter component library 100 described with reference to FIG. 1A and FIG. 1B, the filter component library 200 described with reference to FIGS. 2A and 2B, a combination thereof, a subset thereof, etc.

Moreover, in an example implementation, the magnitude (if any) and phase (if any) are converted from polar notation to rectangular notation as complex numbers in both positive and negative frequencies to transform the FFT of the input signal (also in rectangular notation) to yield a new set of complex numbers which represents the rectangular notation of the filtered output which is then converted to the time domain via an IFFT to yield the filtered output signal. In this sense, once the filter is derived, a library itself is not necessary. Rather, code may be utilized to store just the complex numbers of the fractional order control system on a chip and multiply the input signal by these complex numbers to filter the signal.

In example implementations where the underlying input data is already formatted in the digital frequency domain representation, there may be no need to process the input. However, it is possible to use the digital signal synthesizer 500 to process analog time-series signals. In this case, the digital signal synthesizer 500 may include data conditioning circuitry including an analog to digital converter 512, which couples to a fast Fourier transform module 514 that converts the input from a time domain representation to the complex frequency domain representation, which is then stored in the input buffer 502.

Likewise, the synthesized data can remain in the digital domain, or the synthesized data can be processed, e.g., converted back to an analog time-series representation via an inverse fast Fourier transform module 516 that converts the output stored in the output buffer 508 from the complex frequency domain representation to the time domain representation, and an optional digital-to-analog converter 518 to convert the digital signal back to an analog time-series synthesized signal.

In other examples, the input originates as a digital signal, i.e., no analog-to-digital converter is necessary, however, the fast Fourier transform module 514 is necessary to convert the digital signal to a complex frequency domain representation. Such may be the case when using the digital signal synthesizer 500 to implement an image or video processor, e.g., to process images by carrying out a predetermined image processing function. Also, the input may be in the form of video data, etc., which requires the implementation, e.g., filtering to carry out a predetermined image processing function. Here, an analog output may be generated as described more fully above. Such may be the case where the signal synthesizer is implemented as a tone generator.

In illustrative implementations, the digital signal synthesizer 500 is implemented in a select one of a field programmable gate array (FPGA), an application specific integrated circuit, and a digital signal processing (DSP) chip. In this regard, it should be observed that in certain implementations, e.g., as an FPGA, the chip itself may not natively support components such as an analog-to-digital converter 512 and corresponding digital-to-analog converter 520. In this regard, these functional blocks can be pulled out from the digital signal synthesizer 500, and may be implemented in other chips, such as a dedicated analog-to-digital converter chip and a dedicated digital-to-analog converter chip. In yet further implementations, the analog-to-digital converter 512 and corresponding digital-to-analog converter 520 can be implemented on the same chip, externally connected to the digital signal synthesizer via suitable circuitry. The digital synthesizer 500 can also be implemented in a processing system implemented by a central processing unit chip in combination with memory, e.g., in a special purpose machine such as a controller, robot, machine, appliance, embedded system, etc. The digital signal synthesizer can also be implemented in a computer.

In alternative implementations, the digital signal synthesizer is implemented in a computer readable medium, e.g., so as to be loaded into a computer system to form a special purpose processing device.

In yet further example implementations, the digital signal synthesizer 500 can be connected to one or more sensors 520, which provide an output that is communicated to the input buffer 502 (e.g., either directly or through the analog to digital converter 512 and fast Fourier transform module 514). This enables the digital signal synthesizer to function as an intelligent sensor, as a controller, or other processing device that processes sensor signals with extreme precision. Although the sensor 520 is illustrated as coupled to the analog-to-digital converter 512, in practice, the output of the sensor 520 may couple directly to the input buffer 502, or to the input buffer 502 via alternative processing circuitry (not shown for clarity).

In yet a further optional implementation, the digital signal synthesizer 500 may be implemented as a fractional order proportional-integral-derivative controller (PID controller). In this implementation, a process variable input 522 of a corresponding hardware process provides a signal that feeds the input buffer 502, e.g., directly or via intervening circuitry, e.g., the analog-to-digital converter 512 and fast Fourier transform module 514 as illustrated.

This embodiment also includes a control element 524 that is communicably coupled to the output buffer 508, e.g., directly or via intervening circuitry, such as the inverse fast Fourier transform module 516 and digital-to-analog converter 518 as illustrated. The process variable(s) 522 and corresponding control element 524 can be any desired components where a PID controller is desirable, e.g., to control temperature, regulate flow, pressure, and/or other industrial processes.

In this regard, the digital signal synthesizer 500 may also include a setpoint buffer 524 to store a desired setpoint for the PID controller. In this implementation, the digital signal synthesizer 500 can be implemented in a programmable logic controller (PLC) or as a panel-mounted digital controller.

Yet further, any combination of the features and elements of FIG. 5 can be combined to form a hardware controller, e.g., to perform target acquisition or autopilot controls on an unmanned aerial vehicle (UAV), to control robotic mechanisms, for stability systems, anti-collision systems, avoidance systems, etc.

A software implementation may also be carried out when integrated with the appropriate hardware to support interaction with the process variable(s) 522 and control element 524. Regardless of implementation, in the example of a PID controller, the digital signal synthesizer 500 implements a control loop feedback mechanism (controller) that utilizes the fractional order control system stored in the transform module 504 to calculate an error value as the difference between a measured process variable and the desired setpoint. More specifically, the digital signal synthesizer 500 implements a proportional-integral-derivative controller such that a weighted sum of proportional, integral and derivative values generated by the processing module adjusts the hardware process affected by the control element. Moreover, the digital signal synthesizer 500 can use any combination of the methods of FIG. 3 and/or FIG. 4, as well as the library (or libraries) of FIG. 1A, FIG. 1B, FIG. 2A, and FIG. 2B in any combination thereof.

Design Example

A simplified design example is described with reference to FIGS. 6A-6F, which utilizes the filter component library 100, 200 of FIGS. 1A-2B, and the methods of FIGS. 3-4 to realize a system constructed in a manner as illustrated in FIG. 5.

Identify Desired Frequency and/or Phase Response

As noted with specific reference to box 302 of FIG. 3, in order to build a filter, a designer can start off by identifying a desired frequency and/or phase response that is represented in a frequency domain representation.

Figure 6A:
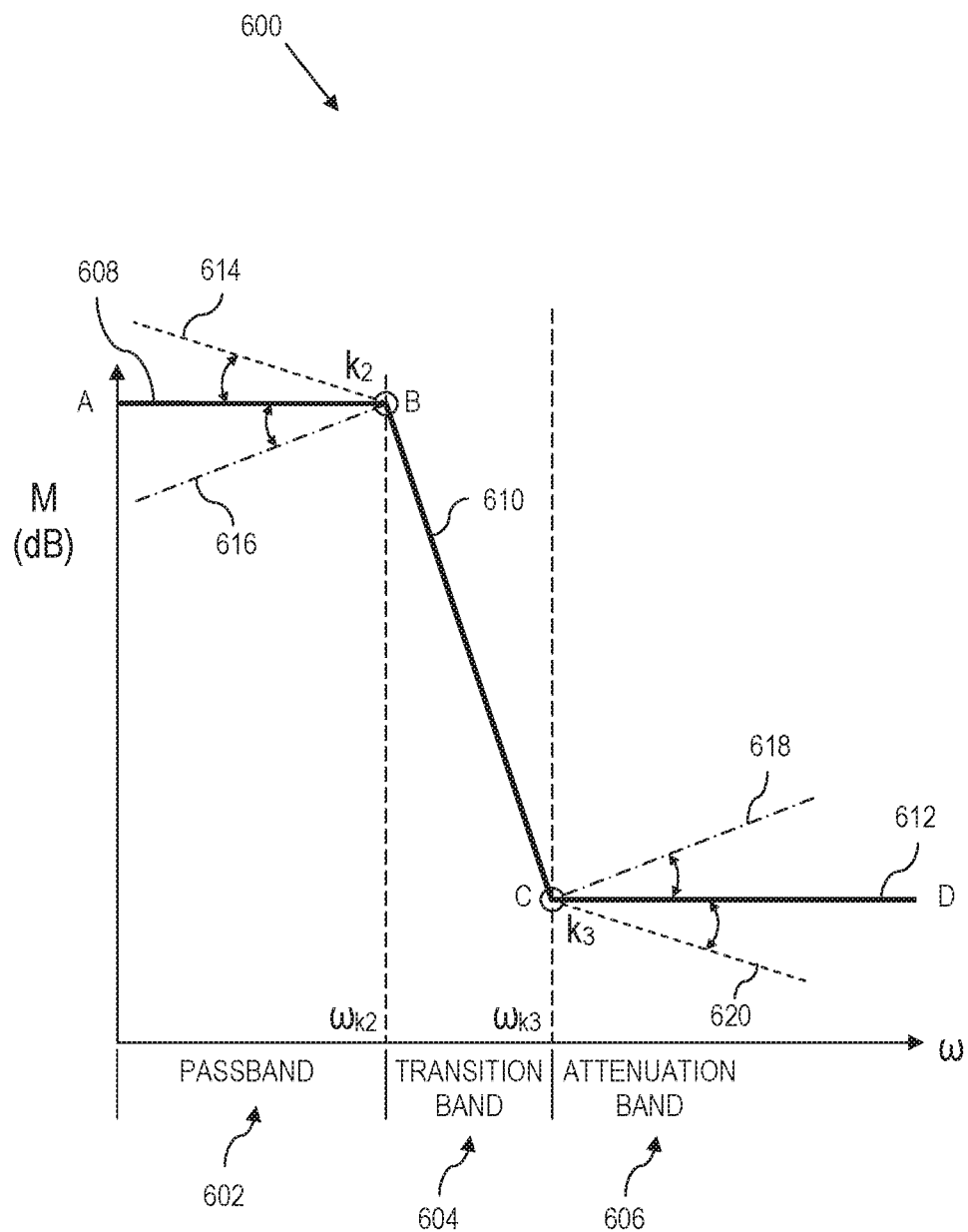
FIG. 6A is an example desired frequency response that is represented in a frequency domain representation as a fractional scaling low-pass filter response.

Referring now to FIG. 6A, an example of using the filter components to build a low-pass filter is shown. The simplified example of FIG. 6A illustrates a magnitude response and does not address a phase response for clarity of illustration of the principles herein. However, the phase component is performed analogously where desired.

The basic shape of a low-pass filter frequency response 600 is shown along curve ABCD. Frequencies along line segment AB are passed in a passband region 602. Line segment BC defines a transition band 604. Likewise, frequencies along line segment CD are attenuated in an attenuation region 606. Thus, the transition band 604 is thus defined between the passband region 602 and the attenuation region 606, and is characterized by a cutoff frequency at point B and a corner frequency at point C.

Constructing a Fractional Order Control System

As noted with specific reference to box 304 of FIG. 3, a next step is constructing a fractional order control system that models the desired frequency and/or phase response (see box 302) by assembling at least one filter component from a filter component library (an example of which is illustrated in FIG. 1A-FIG. 2B).

Because the response of the filter components of FIGS. 1A-2B is additive in the Bode space, the various filter components of the filter component library 100, 200 can be used to create most any ad-hoc shape, including complex shapes and those that are not possible or practical using conventional filters. Moreover, each filter component includes a modest set of variables (e.g., $\omega$, k, $\beta$, d where applicable, etc.) depending upon the filter type. The consistency and limited number of variables, in combination with the definition of the various filter components, greatly simplifies filter design.

A fractional order control system that models the desired frequency response of FIG. 6A, can be built entirely from a selection of a few of the filter components of FIG. 1A. Notably, the basic form of the low-pass filter component 106 has a response that results in passing without change (unless scaled by K), the magnitude of the input in the passband 602, and exhibits a negative slope in the Bode space for frequencies above the cutoff frequency. This means that the higher the frequency above the cutoff frequency, the greater the attenuation.

Correspondingly, the basic form of the high frequency amplifier 110 has a response that results in passing without change (unless scaled), the magnitude of the input in the passband 602, and exhibits a positive slope in the Bode space for frequencies above the corner frequency. This means the higher the frequency (above the corner frequency), the greater the amplification. Because filter component responses are additive in the Bode space, the rate of attenuation of the low-pass filter component 106 can be counteracted by the rate of gain of the high frequency amplifier component 110 for high frequencies, resulting in response segment CD flattening out through the high frequency region. The selection of filter component variables essentially defines the cutoff frequency of the low-pass filter component 106, the corner frequency for the high frequency filter component 110, and the amount of attenuation in the transition band 604.

To build the low-pass filter of FIG. 6A, three components are used: an integrator component, a low-pass filter component, and a high frequency amplifier component (with some low-pass filters, the integrator component is not used). As a way to distinguish values for the filter components for sake of discussion herein, values for the first component include a subscript 1 (e.g., $\eta_1$), values for the second component include a subscript 2 (e.g., $\eta_2$), etc. For example, the integrator component 102 is the first component, so $\beta$ of the integrator component is represented by $\beta_1$.

In the case of the low-pass filter of FIG. 6A, an integrator with a slope of 0 is used as the first component, so $\beta_1=0$ (integrators do not require a value for k). Because the integrator includes a $\beta_1=0$, the integrator component may be left out entirely. However, it is kept in for completeness of the example and to demonstrate how to create any type of frequency response later.

Figure 6B:
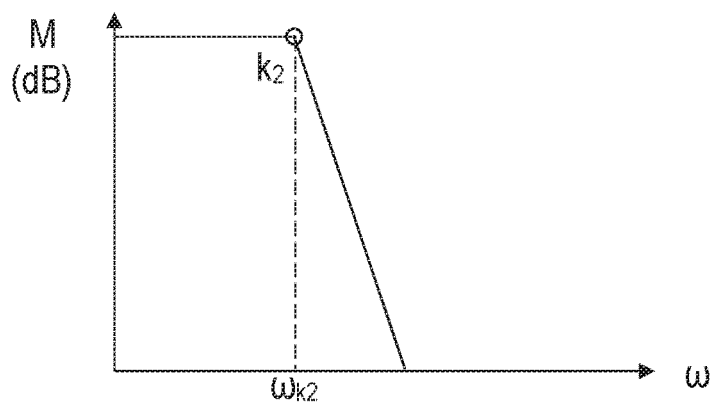
FIG. 6B is an example response of a low-pass filter component from the filter component library of FIG. 1A.

Referring to FIG. 6B, to build the low-pass filter of FIG. 6A, a low-pass filter component 106 is selected from the filter library 100 and is configured with an appropriate value for the fractional scaling exponent $\beta_2$, and the parameter $k_2$ is selected to correspond to the cutoff frequency B.

Figure 6C:
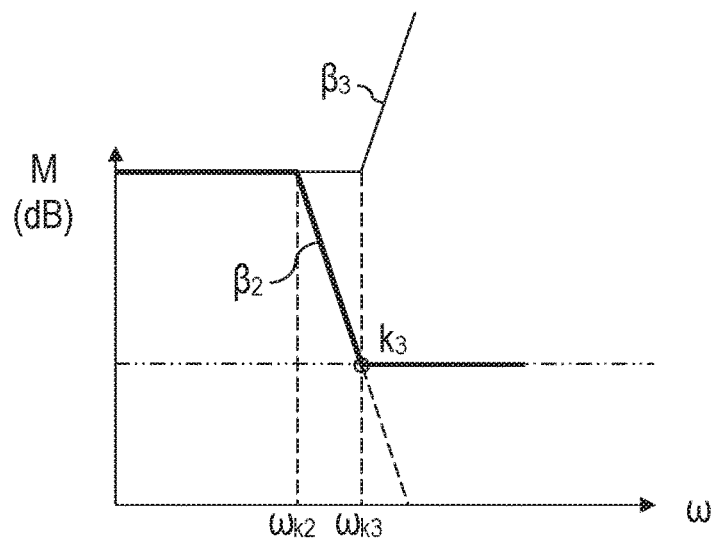
FIG. 6C is an example response of a high frequency amplifier component from the filter component library of FIG. 1A, and a response of a result when the high frequency amplifier component is combined with the low-pass filter component of FIG. 6B, thus realizing a fractional order control system.

Referring to FIG. 6C, to build the low-pass filter, a high frequency amplifier 110 is also selected from the library 100. The high frequency amplifier 110 is configured with an appropriate value for the fractional scaling exponent $\beta_3$, and the parameter $k_3$ is selected to correspond to the corner frequency C. Notably, as best illustrated in FIG. 6C, by setting $\beta_2$-$\beta_3$, the slope of the high frequency attenuation of the low-pass filter (FIG. 6B) is equal and opposite of the slope of the high frequency amplification caused by the high frequency amplifier 110 (FIG. 6C) resulting via summation, of the flat response in line segment CD (FIG. 6A).

Figure 6D:
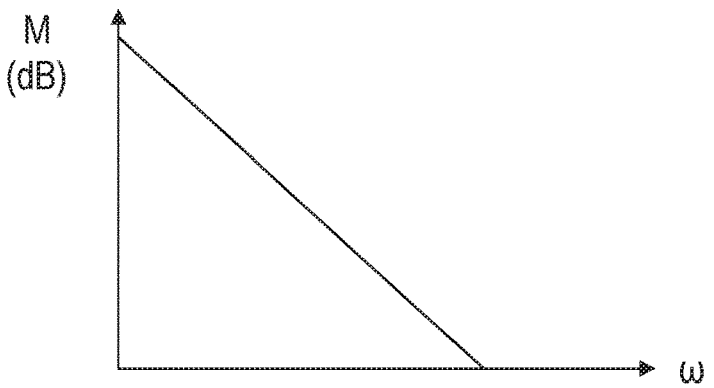
FIG. 6D is an example response of an integrator component from the filter component library of FIG. 1A.

Referring to FIG. 6D, the filter can also utilize an integrator such as the integrator component 102 from the library 100 (or the differentiator 104 from the library 100) to implement scaling correction adjustments in the passband 602, as will be described in greater detail herein.

Thus, the three filter components used to make this filter include an integrator filter component 102 (or differentiator filter component 104), a low-pass filter component 106, and a high frequency amplifier component 110.

The Laplace functions for each filter component are multiplied together to create an equation for the low-pass filter. Recall however, that the multiplication of the Laplace functions is envisioned as addition/subtraction when transformed to Bode space.

Assembling the Filter Components

A low-pass fractional scaling digital filter with low or high frequency scaling correction (SC) may be employed to pass all frequencies within the low frequency passband and attenuate all frequencies within the high frequency stopband while also introducing a scaling correction, in addition to any attenuation, within the low or high frequency bands. The Laplace form of the low-pass fractional scaling digital filter (SC) that includes one integrator component, one low pass filter component, and one high frequency amplifier component is:

$$\frac{O(s)}{I(s)} = \left(\frac{K}{s^{\frac{\beta_1}{2}}}\right)\left(\frac{k_2}{s+k_2}\right)_{\frac{\beta_2}{2}}\left(\frac{s+k_3}{k_3}\right)_{\frac{\beta_3}{2}}$$

Here, $k_2 > k_3$. K is an optional scaling factor. That is, the multiplier K is used to shift the filter up or down so that there is an increase or decrease in magnitude or power respectively across all frequencies. The scaling exponent $\beta$ is shown as a subscript since the equations within the parenthesis are solved for magnitude and phase prior to the introduction of the scaling exponent. Once the low-pass fractional scaling digital filter is solved for magnitude and phase, the scaling exponent $\beta$ is distributed throughout the building block equations.

Notably, the scaling behavior of the filter of the low frequency region (below the gain value $k_2$) is influenced by the integrator/differentiator building block 102, whereas the scaling behavior of the filter of the high frequency region (above the gain value $k_3$) is determined by the interaction of the low-pass filter component 106 and the high frequency amplifier component 110. More precisely, $\beta_1$ controls the low frequency scaling correction, whereas the relationship between $\beta_1$, $\beta_2$, and $\beta_3$ control the scaling correction of the high frequency region (where "low" and "high" frequency regions are relative to the frequencies associated with the gain values $k_2$ and $k_3$). As such, $\beta$ (generally) is a variable of the non-integer, fractional scaling exponent that represents the slope of a power spectrum associated with a corresponding section of the desired frequency response.

Although the equations containing $k_2$ and $k_3$ primarily impact filter scaling correction of the high frequency region, the influence of the transfer function filtering equations of the high frequency region begins at frequencies just below $k_2$ and extends to higher frequencies. Thus, the transfer function filtering equations of the high frequency region do not significantly affect frequencies lower than $k_2$. The absence of the influence of the high frequency transfer function filtering equations at frequencies lower than $k_2$ results in domination of the lower frequency region by the integrator filter component 102 (or differentiator 104) with optional multiplier K. Basically, the slope in any region is the sum of the slopes of all the components present before that region.

Using the equations set out more fully herein, the magnitude of the low-pass fractional scaling digital filter is given by:

$$M = \left(\frac{K}{\omega^{\frac{\beta_1}{2}}}\right)\left(\frac{k_2^{\beta_2}}{\omega^{\beta_2}+k_2^{\beta_2}}\right)\left(\frac{\omega^{\beta_3}+k_3^{\beta_3}}{k_3^{\beta_3}}\right)$$

The magnitude of the low-pass fractional scaling digital filter in Bode space in (dB) is:

$$M(\mathrm{dB}) = 20\log\left(\frac{K}{\omega^{\frac{\beta_1}{2}}}\right) + 20\log\left(\frac{k_2^{\beta_2}}{\omega^{\beta_2}+k_2^{\beta_2}}\right) + 20\log\left(\frac{\omega^{\beta_3}+k_3^{\beta_3}}{k_3^{\beta_3}}\right)$$

To obtain the variables to enter into the equation, a designer can specify a desired $\beta$ for each component. For sake of a simplified example, assume $\beta_1=0$, and $\beta_2=\beta_3$. This simplifies the value for the integrator filter component to K. If K=1, a traditional low-pass filter response is realized. The variable w is the angular frequency in radians and is readily computed as $\omega=2\pi/T$ where T is the period of the system. Next, the filter designer can specify $k_2$. More specifically, $k_2$ is converted to an angular frequency $\omega_{k2}$ and identifies the cutoff frequency of the low-pass filter in terms angular frequency (see point B in FIG. 6A). The value for $k_3$ (see point C in FIG. 6A) can be determined in a number of ways. In particular, the value for $k_3$ is a function of the slope of the transition band 604, and the desired attenuation (in dB) of the transition band 604. Thus, the k values are described in terms of gain because the transition band 604 attenuation is defined between $k_2$ and $k_3$. By comparison, an optional value K>1 can be used to shift the entire response up in magnitude, while setting K to be between 0 and 1 will shift the entire response down in magnitude.

Figure 6E:
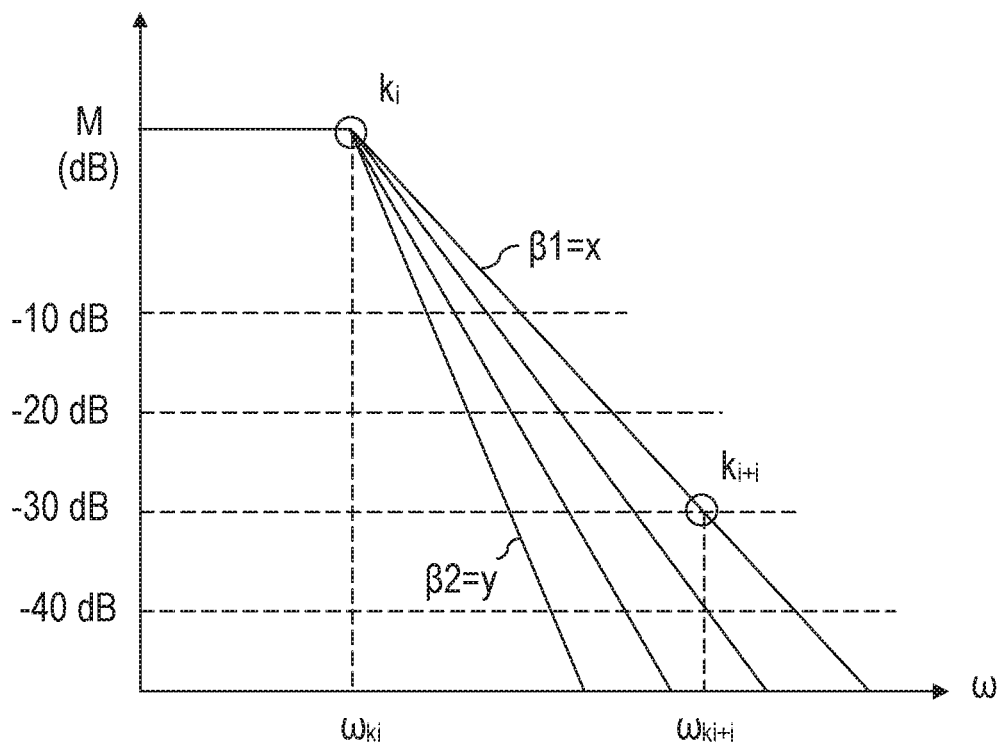
FIG. 6E is a chart that demonstrates an example approach of selecting component values when designing a filter.

Referring to FIG. 6E, depending upon the value of $\beta$ in the transition band 604, the slope of the transition will vary. In the example, $\beta 2=y$ is steeper than $\beta 1=x$. Assume that a desired transition band between $k_i$ and $k_{i+1}$ is −30 dB with a slope of $\beta 1$. The value for $k_{i+1}$ can be found by following down the line $\beta 1$ until $k_{i+1}$ reaches the −30 dB point. From this mapping, $\omega_{ki+1}$ is readily calculated The magnitude in Bode space (M(dB)), after addition of each value of the transfer function at each angular frequency, may then be converted to back to magnitude (M) by taking the anti-log of the result M(dB) divided by 20 as:

$$M = 10^{\frac{M_{(dB)}}{20}}$$

The intermediary step of adding the values in Bode space is useful in both computer executed algorithms and when graphically adding magnitude (or power) in Bode space to determine the collective interaction of each building block transfer functions.

If the designer were performing a corresponding phase adjustment, the corresponding phase equations in radians for positive frequencies (+w), of the low-pass fractional scaling digital filter from FIG. 2A would be:

$$\theta_{(+\omega)} = \left(\frac{-\beta_1\pi}{4}\right) + \left(-\tan^{-1}\left(\frac{\omega^{\frac{\beta_2}{2}}}{k_2^{\frac{\beta_2}{2}}}\right)\right) + \left(\tan^{-1}\left(\frac{\omega^{\frac{\beta_3}{2}}}{k_3^{\frac{\beta_3}{2}}}\right)\right)$$

The phase of the negative frequencies $\theta_{(-\omega)}$ is calculated using the method of FIG. 4, e.g., through the reversal of the phase values of the positive frequencies $\theta_{(+\omega)}$ of the low-pass fractional scaling digital filter and multiplication by −1 to recover the odd symmetry behavior of phase as: $\theta_{(-\omega)} = \theta_{(+\omega)} \cdot -1$.

The positive and negative frequencies are then concatenated, inserting a phase of θ=0 at the zero frequency and Nyquist frequency such that the final phase of the low-pass fractional scaling filter exhibits odd symmetry. Notably, there is no need to convert the phase to Bode space to take advantage of additive properties of the filtering described herein.

General Observations about Constructing a Fractional Order Control System

Referring back to FIG. 6A, even within a simplified example of a low-pass filter, complex shapes can be realized simply by controlling the values for β. In particular, at least nine different filter shapes can be realized by varying the relationships of the β values. More particularly, if $\beta_1=0$, then segment AB is flat. However, setting $\beta_1>0$ causes the integrator to introduce gain into the response, causing the segment AB to have a negative slope (lower frequencies are higher in magnitude in the passband) as illustrated by segment 614. On the other hand, setting $\beta_1<0$ effectively replaces the integrator filter component with a differentiator component (because β is negative), causing the passband segment AB to have a positive slope (lower frequencies are lower in magnitude in the passband) as illustrated by segment 616.

Setting $\beta_3=\beta_1+\beta_2$ causes the attenuation band response to be a flat line (line segment CD is flat). However, setting $\beta_3>\eta_1+\beta_2$ causes the attenuation band segment CD to have a positive slope (lower frequencies are lower in magnitude in the attenuation band) as illustrated by segment 618. Correspondingly, setting $\beta_3<\beta_1+\beta_2$ causes the attenuation band segment CD to have a negative slope (lower frequencies are higher in magnitude in the attenuation band) as illustrated by segment 620. This ability is not present in conventional filter technologies.

To draw some further distinctions from conventional filter approaches, it can be observed that β=2×Conventional Filter Order (i.e., 6 dB/Octave). Thus, a β of 8 corresponds to a conventional fourth order filter. However, according to the present disclosure, β can be as high as stability allows, easily reaching orders of 84 or higher, thus producing an equivalent to a 42nd order filter, with no in-band or out-of-band ripple. This attribute alone significantly improves the technical field of signal filtering by providing superior filters. Moreover, the design approach enables filters to be designed faster, without reliance on lookup tables or cumbersome constants, and with unique characteristics not possible before the filters disclosed herein, thus further improving the technical field of filter design by enabling rapid filter design and development. Moreover, because the equations are additive, the solution resolves to a format of a single size that is independent upon the slope/order of the filter cutoff. Thus, the filters herein improve the technological field of filter design by providing filters that require less overall processing power for a superior filter, while providing a simplified hardware and/or digital realization, as will be described in greater detail herein.

The slope of each line segment is affected by β for each component. For example, to make the frequency response 600 of FIG. 6, the integrator component will have a β of zero (i.e., $\beta_1=0$) creating a flat line of no slope for line segment AB. However, at a cutoff frequency of the frequency response 600 (i.e., IQ), the low-pass filter component includes a high value for β to have a sharp decrease in the transition band 606. For example, a β of eighty-five will produce a sharp cutoff, while a β of four will have a more gradual cutoff for line segment BC. To create a flat line of slope zero in the attenuation region 604 (i.e., line segment CD), the high frequency amplifier component will have a β equal to the sum of the β of the integrator component and the β of the low-pass filter component. The cutoff frequency for the high frequency amplifier component is determined by the β of the low-pass filter component and a desired attenuation within the attenuation region 604. Moreover, β itself can be fractional. For instance, a designer can readily select β based upon the formula β/10=desired dB/decade. Thus, a slope of 35 dB/decade will have β=3.5.

For example, assume a user wants to build a forty-second-and-a-half order low-pass filter with a flat passband (segment AB) and a flat attenuation band (segment CD), at a corner frequency of 1 kHz with 30 dB attenuation in the transition band. The integrator component includes only one variable: β (assuming K=1), and the desired slope in the pass region 602 of the desired forty-second-and-a-half order low-pass filter is zero. Thus, $\beta_1=0$. The second component, a low-pass filter component, includes a slope and a cutoff frequency. From the specification of the low-pass filter, $k_2$ (i.e., the cutoff frequency of the second component) is 1 kHz (which must be converted to an angular frequency) and $\beta_2$ is eighty-five (i.e., the desired order of filter times two minus $\beta_1$). To determine $\beta_3$ (i.e., β for the high frequency amplifier), $\beta_1$ is added to $\beta_2$ (i.e., 0+85), which yields eighty-five.

The corner frequency for the high frequency amplifier (i.e., $k_3$) may be determined using a ratio of the slope of $\beta_2$. With a $\beta_2=85$, the slope within the transition band 604 is 85/2×6 dB/octave. Using the rise/run formula for slope, then 30 dB/(85/2×6 dB/Octave)=0.117 shift from $k_2$, which can be converted to angular frequency as set out in greater detail herein.

The determined values are plugged in to the equation for a low-pass filter and the complex values for the transfer function result. These complex values of the transfer function may be stored in a memory for later use on a signal.

To make different low-pass filters, other β values may be used. For example, if a positive slope is desired in the pass region 602, then $\beta_1<0$. Conversely, if a negative slope is desired in the pass region 602, then $\beta_1>0$. The slope in the transition band 604 is $\beta_1+\beta_2$. If a positive slope is desired in the attenuation region, then $\beta_3<\beta_1+\beta_2$. Conversely, if a negative slope is desired in the attenuation region, then $\beta_3>\beta_1+\beta_2$. Note that the slope for a region is dependent on the slopes of the regions preceding the region. More components may be added with different cutoff values and slopes to create any desired shape.

Figure 6F:
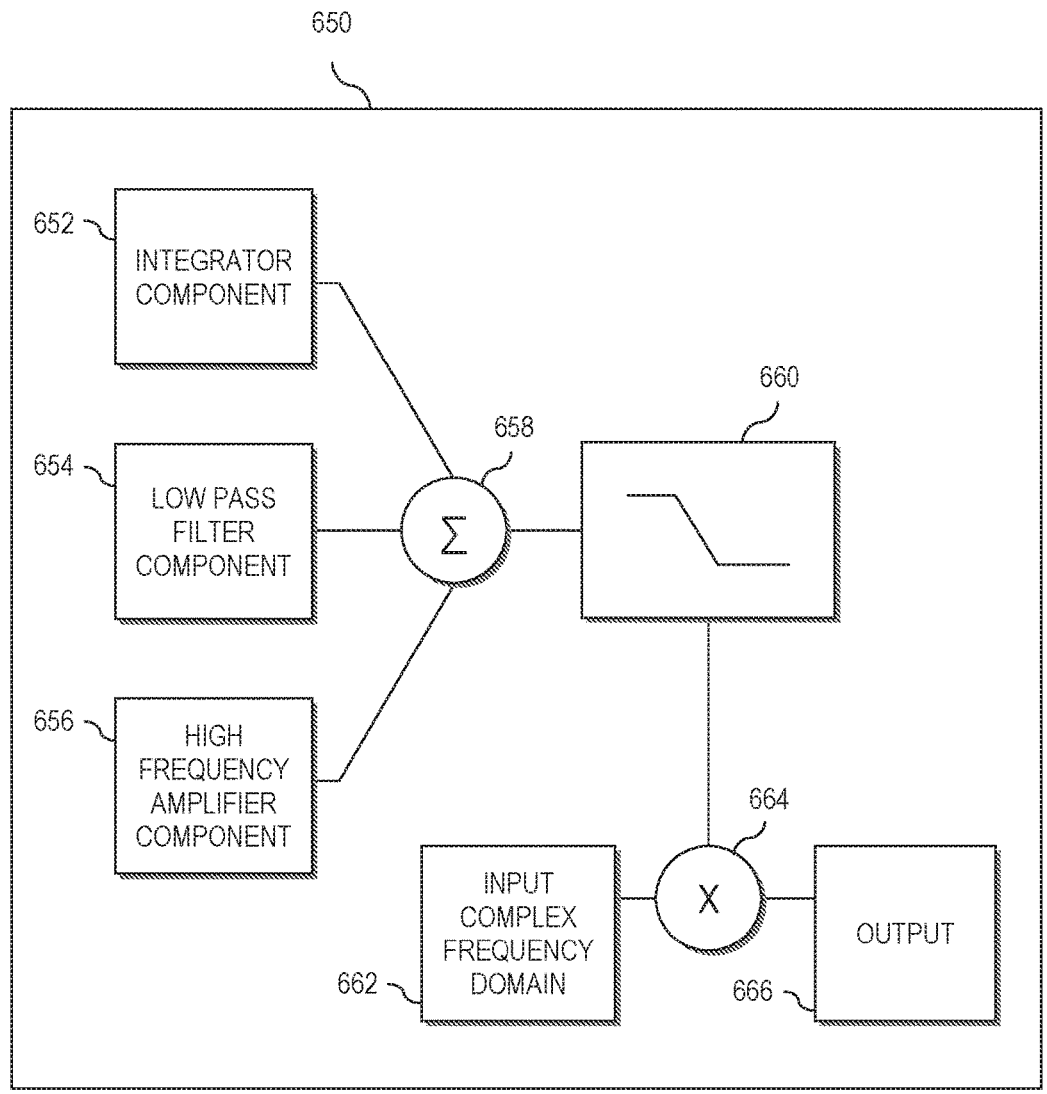
FIG. 6F is an example system that is constructed to implement the desired frequency response of FIG. 6A via the fractional order control system of FIG. 6C.

Referring to FIG. 6F, an example implementation of a system (e.g., an instance of the system 500 is illustrated. A system controller 650, e.g., a processing chip includes an integrator module 652, e.g., which stores an integrator corresponding to the integrator component 102 of FIG. 1A. The system controller 650 also includes a low-pass filter module 654, e.g., which stores a low-pass filter corresponding to low-pass filter component 106 of FIG. 1A. The system controller 650 further includes a high frequency amplifier module 656, e.g., which stores a high frequency amplifier corresponding to the high frequency amplifier 110 of FIG. 1A. The filter components realized by the integrator module 652, the low-pass filter module 654, and the high frequency amplifier module 656 are summed (e.g., in Bode space based upon frequency domain representations) to produce a fractional order control system 660.

An input, in the complex frequency domain representation 662 is multiplied by a multiplier 664 with the complex values of the fractional order control system 660 to produce an output 666, which can be used to drive a downstream process.

Although a simple low-pass filter is illustrated for purposes of clarity, it should be readily apparent that any one or more filter components can be combined to produce other filter types, such as a high pass fractional scaling filter $$\text{(e.g., } \frac{O(s)}{I(s)} = (K)\left(\frac{s+k_1}{k_1}\right)_{\frac{\beta_1}{2}}\left(\frac{k_2}{s+k_2}\right)_{\frac{\beta_2}{2}},$$

band pass fractional scaling filter $$\text{(e.g., } \frac{O(s)}{I(s)} = (K)\left(\frac{s+k_1}{k_1}\right)_{\frac{\beta_1}{2}}\left(\frac{k_2}{s+k_2}\right)_{\frac{\beta_2}{2}}\left(\frac{k_3}{s+k_3}\right)_{\frac{\beta_3}{2}}\left(\frac{s+k_4}{k_4}\right)_{\frac{\beta_4}{2}},$$

a notch fractional scaling filter $$\text{(e.g., } \frac{O(s)}{I(s)} = (K)\left(\frac{k_1}{s+k_1}\right)_{\frac{\beta_1}{2}}\left(\frac{s+k_2}{k_2}\right)_{\frac{\beta_2}{2}}\left(\frac{s+k_3}{k_3}\right)_{\frac{\beta_3}{2}}\left(\frac{k_4}{s+k_4}\right)_{\frac{\beta_4}{2}},$$

a resonance fractional scaling filter $$\text{(e.g., } \frac{O(s)}{I(s)} = \left(\frac{k_1^2}{s^2+2dk_1s+k_1^2}\right)_{\frac{\beta_1}{4}}\left(\frac{s+k_2}{k_2}\right)_{\frac{\beta_2}{2}},$$

a resonance fractional scaling filter with scaling correction $$\text{(e.g., } \frac{O(s)}{I(s)} = \left(\frac{K}{s^{\frac{\beta_1}{2}}}\right)\left(\frac{k_1^2}{s^2+2dk_1s+k_1^2}\right)_{\frac{\beta_2}{4}}\left(\frac{s+k_2}{k_2}\right)_{\frac{\beta_3}{2}},$$

harmonic resonance fractional scaling filter $$\text{(e.g., } HR_1 = \left(\frac{K}{s^{\frac{\beta_1}{2}}}\right)\left(\frac{k_1^2}{s^2+2dk_1s+k_1^2}\right)_{\frac{\beta_2}{4}}\left(\frac{s+k_2}{k_2}\right)_{\frac{\beta_3}{2}}$$

thus $HR=HR_1 \times HR_2 \times \ldots HR_n$), or any other complex fractional scaling digital filter or frequency response model can be assembled, combined with other frequency response models, etc.

Notably, the fractional scaling filters are not limited to one instance of the filter per transfer function equation. Rather, several instances can be linked together. For instance, the harmonic resonance fractional scaling filter can be implemented as several resonance fractional scaling filters, such as to filter harmonics, generate a synthetic signal with well defined harmonics. Here, the variables of each instance of a resonance fractional scaling filter making up the harmonic resonance fractional scaling filter are configured to represent several periodicities or harmonics occurring within a single signal. More specifically, the frequency locations of harmonic resonant peaks are set by the gain (k) values, whereas the height and width of the resonance peaks are determined by d and β values. Moreover, since one resonance fractional scaling filter represents each harmonic individually, each harmonic can be completely customized and different from the other harmonics in terms of filtering characteristics. Convolving any input signal with the harmonic resonance fractional scaling filter, a completely synthetic signal is generated as an output with well defined harmonics as the specified resonance frequencies. Analogously, deconvolving an input removes multiple harmonics from a signal through attenuation. Thus, filters can be combined to create complex systems including synthesizers, tone generators, musical instruments, etc.

Moreover, one or more filter components (of the same or different filter type) can be combined to produce exceedingly complex filter characteristics. As an example, a model can include a first set of filter components to characterize relatively lower frequencies, and a different group of filter components to characterize relatively higher frequencies. As another example, the fractional scaling techniques herein can be used to accurately quantify noise within natural stochastic time series and to computationally model the dynamic scaling behavior of natural and stochastic complex systems that represent the physical or mathematical process (es) responsible for the generation of these signals. A method of generating synthetic noise is provided below with reference to an encoder/decoder example. The fractional scaling techniques herein can also be used as digital filters that appear in a vast number of applications. Moreover, the fractional scaling techniques herein can be used to implement control systems, image processing, video processing and other signal processing, etc.

Using the various components of the filter component library, any desired frequency response with different slopes and attenuation levels along different frequencies may be achieved in a similar manner as discussed above, with a high degree of accuracy from sharp transitions within a narrow bandwidth to complicated structures within the passband, all without introducing the mathematical artifacts of current state-of-the-art filters or resulting in a loss of information in the filtered signal.

FIR Example

Figure 7:
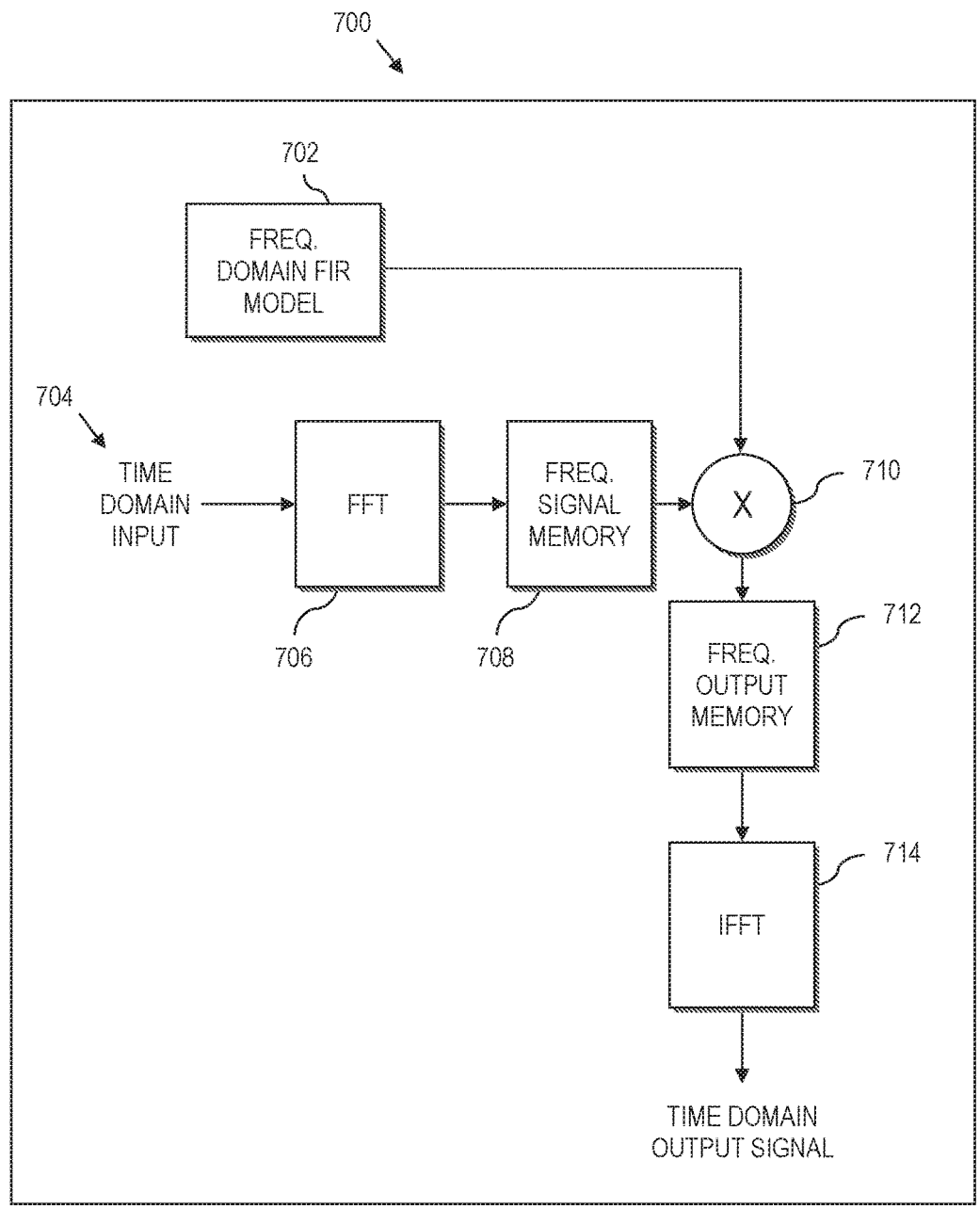
FIG. 7 is a schematic example implementation using a field programmable gate array to implement a digital filter defined by a Laplace function that includes a non-integer control order having a variable fractional scaling exponent.

Referring now to FIG. 7, an example system 700 illustrates the method 300 of FIG. 3 being used as a finite impulse response (FIR) filter to filter frequencies of a digital input signal. As seen in the example of FIG. 6, the shape of a transfer function H(s) can be built from filter component of the filter component library 100, 200 (FIGS. 1A-2B). The resulting complex values for the transfer function (already within the frequency domain) are stored within a FIR filter transfer function memory 702.

A signal 704 within the time domain is set as an input to the system 700. If the time-domain signal is not already a digital signal (i.e., if the signal is an analog signal), then the time-domain signal should be run through an analog-to-digital converter (not shown), as discussed in reference to FIG. 5. The digital time-domain signal 704 feeds a fast Fourier transform (FFT) component 706 to convert the signal 704 from the time domain to the complex frequency domain. As shown, the input signal 704 feeds the FFT 706 directly. However, one or more samples of the input signal may be placed in a buffer before reaching the FFT 706.

The output of the FFT 706 feeds a memory 708 that stores the input signal represented in the frequency domain. Thus, the size of the frequency-domain signal memory 708 is dependent on the number of points of the FFT (e.g., a 1024-point FFT will require a frequency-domain signal memory 708 of at least 1024 addresses). Further, the size of the FIR filter transfer function memory 702 is dependent on the number of points of the FFT (e.g., a 1024-point FFT will require a FIR filter transfer function memory 702 of 1024 addresses).

To perform convolution of a signal in the frequency domain, a multiplication is used. Therefore, each point of the frequency-domain input signal is multiplied 710 by a corresponding point of the FIR filter transfer function. For example, a counter may be used to address both the frequency-domain signal memory 708 and the FIR filter transfer function memory 702, where the outputs of the memories 702, 708 feed a multiplier 710. The result of the multiplication is then stored in a frequency-domain output memory 712. For example, the counter may also address the frequency-domain output memory 712 (with any number of delay taps as there are pipeline stages in the multiplier 710 if any pipeline stages are present within the multiplier).

The frequency-domain output memory 712 may be run through a second FFT 714 (illustrated as an inverse fast Fourier transform) 714 to transfer the output into a time-domain output. In some cases, the second FFT 714 may be the first FFT 706. For example, in a low throughput system, the FFT 706 may be time-multiplexed to accommodate transforming the time-domain input signal 704 and the frequency-domain output. However, in high throughput systems, there should be two separate FFTs 706, 714.

The use of the system 700 shortens the number of clock cycles to perform a convolution on a signal by removing several multiplication steps and adder trees associated with performing a convolution in the time domain.

Encoder/Decoder

Another example application includes an encoder/decoder. As mentioned above, the filter components may be used to create a system that generates noise of a specific function. The encoder/decoder capability utilizes the features and techniques of fractional scaling as set out more fully herein.

For instance, with reference back to FIG. 3, this example method of processing a digital signal to perform encoding/decoding comprises identifying at 302, a desired frequency and/or phase response that is represented in a frequency domain representation by identifying a desired frequency response to shape a noise.

By way of example, a designer starts by selecting a scaling exponent of a system, designated as $\beta_s$. The designer then obtains a noise signal as an input x[n]. The noise signal may comprise Gaussian white noise, some randomized noise, sampled noise from a noise source (e.g., radio static, etc.). The noise input is processed by an FFT to produce a complex frequency domain representation of the input, e.g., in rectangular notation X[s]. The rectangular notation input is then converted to polar notation and a power spectrum of the noise (e.g., $P=(\sqrt{x^2+y^2})^2$. With the noise converted, the scaling input is determined from the power spectrum.

Referring back to FIG. 3, in this example, a fractional order control system is constructed at 304 by modifying the scaling exponent of the system based upon the scaling exponent of the input such that $\beta_s = \beta_s + \beta_I$. The scaling exponent $\beta_s$ is incorporated into a single scaling transfer function (e.g., the integrator component)

$$\frac{1}{s^{\beta/2}},$$

where $\beta = \beta_s$. A single transfer function is then solved for both magnitude and phase at each complex frequency $$\left(e.g., H[s] = \frac{1}{s^{\beta/2}}\right)$$

where magnitude $$M_{(\pm\omega)} = \frac{1}{\omega^{\frac{\beta}{2}}}, \quad \theta_{(+\omega)} = -\frac{\beta\pi}{4}, \text{ and } \theta_{(-\omega)} = \frac{\beta\pi}{4}.$$

The transfer function is converted back from polar notation to rectangular notation, e.g., x=M cos(θ); y=M sin(θ) such that H[s]=x+jy.

With reference back to FIG. 3, in this example, an input is received at 306 by receiving the noise as an input. Likewise, in this example, processing the input at 308 comprises multiplying a frequency domain representation of the noise (e.g., rectangular notation of the noise) by the (rectangular notion of the) model of the desired frequency response to generate the digital output. This results in a rectangular notation of a new output noise as Y[s].

Before leaving the complex frequency domain, the process further processes the digital output by creating a copy of the digital output shifted by one-hundred-and-eighty degrees to generate an inverse digital output. The digital output and the inverse digital output are then converted back to the time domain to realize output noise with the same scaling behavior as the input noise.

The encoder/decoder is further constructed by embedding a payload signal into a select one of the digital output and the inverse digital output (e.g., in the time domain) to create a transmission signal, designating the remaining one of the digital output and the inverse digital output as a key signal. For instance, a message, information, data, etc., can be buried deeply into the noise of the transmission signal. The key signal is conveyed to a receiver. For instance, the key signal is passed off to the receiver at a first time. The transmission signal is also communicated to the receiver, but preferably in a manner that is separate from the conveyance of the key signal to the receiver.

To recover the payload, e.g., message, the receiver mixes the transmission signal and the key signal in synchronization. This results in the noise component of the transmission signal canceling with the noise of the key signal (since they are 180 degrees out of phase) revealing and unmasking the payload. Thus, messages can be concealed to all except those with the key signal to unmask the signal. This can be used to encode real-time message, transmit static data, or any other desired payload.

Thus, the encoder/decoder provides an example use of phase only modification of a signal (e.g., to create the key necessary to unmask the payload). Also, since the output noise is synthesized, the noise source can be regenerated, resulting in an endless possibility of new noise fingerprints, thus ensuring the tight correlation between a key signal and a corresponding transmission signal. To obtain a new unique pair, the synthetic noise simply needs to be regenerated, and a new and unique noise fingerprint is derived. Moreover, the above approach can be used to generate noise signals that are not embedded with a payload, e.g., to generate a synthetic version of a modeled signal, thus allowing the ability to generate as many statistically accurate representations of an underlying signal as desired. Here, the phase-shifted version of the output is not necessary.

Miscellaneous Considerations

In the filters herein, values of the fractional scaling exponent β may be fractional and do not have to be integers.

Information contained within natural and stochastic complex systems and signals may be modeled more accurately using fractional scaling digital filters within frequency response models (FRM) allowing for the development of quantitative, equation-based models of the dynamics of these natural and stochastic complex systems which then can be used to generate entirely synthetic signals that are statistically identical to the signals that would normally emerge from these systems.

Furthermore, fractional scaling digital filters allow for a variety of selective filtering capabilities and may also perform magnitude-only frequency modifications (without phase distortion or with only a linear phase) or phase-only frequency modifications on any signal by using the equivalent portion of the filter providing flexibility in the filter design.

With this new class of transfer functions, one may design digital filters from fractional scaling digital filters with fractional control orders to allow precise modification of the fractional scaling and/or phase shifting of the frequency content of any signal.

Fractional scaling digital filters can also act as "smart" digital signal processing filters that self-adjust in near-real time to the measured input signal actively adapting to fluctuations or noise within the signal to yield the desired filtered response.

When comparing the performance of traditional DSP filters versus the performance of a fractional scaling digital filter, fewer equations and parameters are necessary to achieve fractional rates of attenuation of specific frequency regions translating into a reduction in the amount of time necessary for calculations. In essence, a fractional scaling digital filter provides the capability to fractionally filter any signal leading to a more effective and finely tuned filter than is possible with conventional filter designs which do not utilize fractional calculus.

By employing algorithms containing the mathematics of fractional scaling digital filters, innovative software and hardware applications may be developed allowing fractional control order digital filters to become widely accessible across industries. User-friendly software implementations of the mathematical algorithms of fractional scaling digital filters may include a blockset as an embedded systems testing environment.

Hardware implementations include encoding the fractional scaling digital filters into a field-programmable gate array (FPGA) device or within a DSP chipset which may then be used to perform fractional filtering on digital signals, build digital "smart" adaptive fractional filters, or enhance the sensitivity of sensors within the commercial, scientific, and defense industries.

Fractional scaling digital filters also provide a method to quantitatively describe the harmonic spectrum of a scale of notes of a variety of musical instruments and allow for the development of a frequency response model for each note of a musical instrument which may be used to generate purely mathematical but realistic musical sounds for use in digital synthesizers and software.

In digital circuits, filters, and systems, fractional scaling digital filters can reduce computation time, increase efficiency allowing for faster circuits or response through the system, and improve the accuracy of circuits and filters eliminating approximation errors.

As another added benefit, some aspects of current control systems may be better defined by more accurate and efficient fractional order control systems through the substitution of the equations of fractional scaling digital filters for the traditional DSP filter equations.

As the equations that also define control and movement, control algorithms that use the fractional mathematics of fractional scaling digital filters to model the dynamic behavior of systems may also improve the response, stability, and machine learning capability of robotic platforms such as bionics, wearable exoskeletons, and unmanned vehicles.

Thus, the fractional mathematics of fractional scaling digital filters ultimately may provide greater command and control of filtered signals leading to the ability to more accurately define movement and control algorithms. Fractional order control systems, such as a fractional order proportional-integral-derivative (PID) controller, provide greater stability and performance under strong perturbations since fractional control systems are more flexible, better able to adapt to dynamic properties of an environment, and also have more effective damping characteristics. Any device, robot, platform, or vehicle controlled by fractional control systems which utilize fractional scaling digital filters may recover faster and with greater accuracy from disturbances allowing for smoother and more efficient control than the same controlled by conventional control systems which use traditional DSP filters.

Overall, the development of Fractional Scaling Digital Filters offers the potential to revolutionize the way in which we currently see, model, filter, and control digital signals and systems and represents a remarkable technological advancement over conventional digital filter designs. The usefulness of Fractional Scaling Digital Filters and their use in fractional order control systems extends across a multitude of disciplines and industries from control theory, cybernetics, information theory, medicine, neuroscience, neuroengineering, cognitive science, and the human behavioral sciences to the environmental sciences, meteorology, geophysics, aerospace, control systems, robotics, mechanical engineering, mechatronics, sensors, electrical engineering, telecommunications, audio, video, and digital signal processing with numerous applications such as RADAR and SONAR Data Acquisition Systems. Thus, the increased accuracy and precision of Fractional Scaling Digital Filters combined with a fractional order control systems approach may rapidly accelerate technological developments in a variety of fields to generate robust solutions for the future.

Computer System Overview

Figure 8:
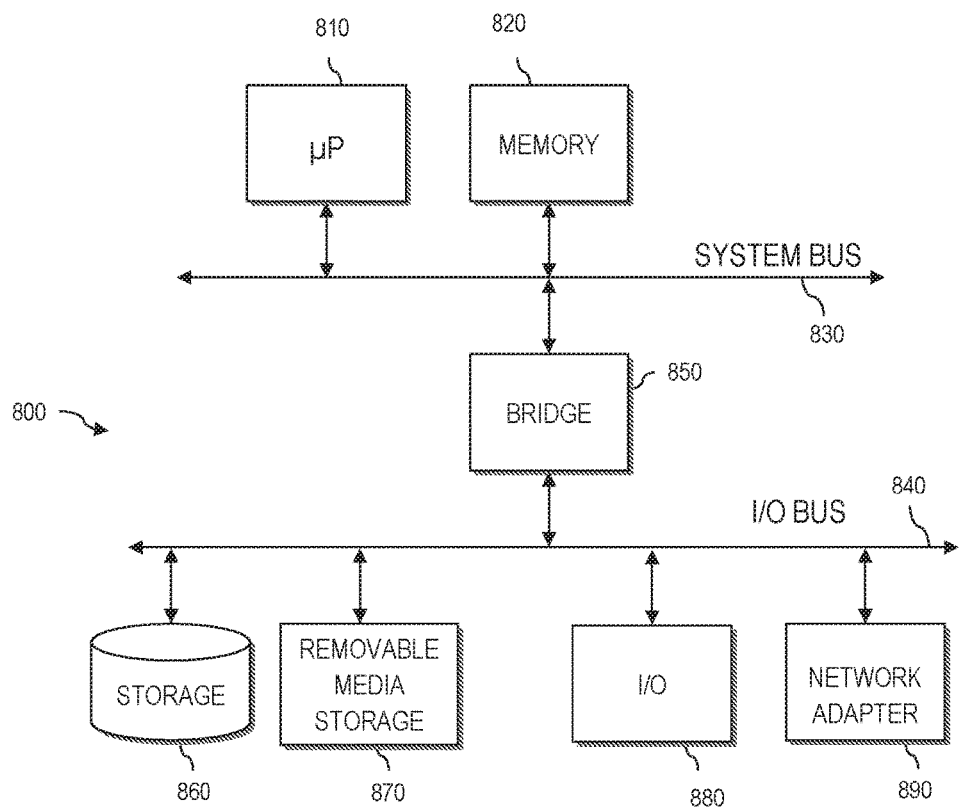
FIG. 8 is an schematic representation of a computer capable of carrying out the systems and methods described more fully herein with regard to the above-figures.

Referring to FIG. 8, a schematic block diagram illustrates an exemplary computer system 800 for implementing the various methods described herein. The exemplary computer system 800 includes one or more (hardware) microprocessors (μP) 810 and corresponding (hardware) memory 820 (e.g., random access memory and/or read only memory) that are connected to a system bus 830. Information can be passed between the system bus 830 and bus 840 by a suitable bridge 850. The bus 840 is used to interface peripherals with the one or more microprocessors (μP) 810, such as storage

860 (e.g., hard disk drives); removable media storage devices 870 (e.g., flash drives, DVD-ROM drives, CD-ROM drives, floppy drives, etc.); I/O devices 880 (e.g., mouse, keyboard, monitor, printer, scanner, etc.); and a network adapter 890. The above list of peripherals is presented by way of illustration, and is not intended to be limiting. Other peripheral devices may be suitably integrated into the computer system 800. The memory 820, storage 860, removable media insertable into the removable media storage 870 or combinations thereof, can be used to implement the methods, configurations, interfaces and other aspects set out and described herein.

The microprocessor(s) 810 control operation of the exemplary computer system 800. Moreover, one or more of the microprocessor(s) 810 execute computer readable code that instructs the microprocessor(s) 810 to implement the methods and processes herein. The computer readable code may be stored for instance, in the memory 820, storage 860, removable media storage device 870 or other suitable tangible storage medium accessible by the microprocessor(s) 810. The memory 820 can also function as a working memory, e.g., to store data, an operating system, etc.

The methods and processes herein may be implemented as a machine-executable method executed on a computer system, e.g., one or more of the processing devices described more fully herein. In this regard, the methods and processes herein may be implemented on a computer-readable storage device (e.g., computer-readable storage hardware) that stores machine-executable program code, where the program code instructs a processor to implement the described method/process. The methods and processes herein may also be executed by a processor coupled to memory, where the processor is programmed by program code stored in the memory, to perform the described method.

Thus, the exemplary computer system 800 or components thereof can implement methods and computer-readable storage devices as set out in greater detail herein. Other computer configurations may also implement the methods and computer-readable storage devices as set out in greater detail herein. Computer program code for carrying out operations for aspects of the present disclosure may be written in any combination of one or more programming languages. The program code may execute entirely on the computer system 800 or partly on the computer system 800. In the latter scenario, the remote computer may be connected to the computer system 800 through any type of network connection, e.g., using the network adapter 890 of the computer system 800.

In implementing computer aspects of the present disclosure, any combination of computer-readable medium may be utilized. The computer-readable medium may be a computer readable signal medium, a computer-readable storage medium, or a combination thereof. Moreover, a computer-readable storage medium may be implemented in practice as one or more distinct mediums.

A computer-readable signal medium is a transitory propagating signal per se. A computer-readable signal medium may include computer readable program code embodied therein, for example, as a propagated data signal in baseband or as part of a carrier wave. However, specifically, a computer-readable signal medium does not encompass a computer-readable storage medium.

A computer-readable storage medium is a tangible device/hardware that can retain and store a program (instructions) for use by or in connection with an instruction execution system, apparatus, or device, e.g., a computer or other processing device set out more fully herein. Notably, a computer-readable storage medium does not encompass a computer-readable signal medium. Thus, a computer readable storage medium, as used herein, is not to be construed as being transitory signals per se, such as radio waves or other freely propagating electromagnetic waves through a transmission media.

Specific examples (a non-exhaustive list) of the computer-readable storage medium include the following: a hard disk, a random access memory (RAM), a read-only memory (ROM), an erasable programmable read-only memory (EPROM), Flash memory, a portable computer storage device, an optical storage device such as a compact disc read-only memory (CD-ROM) or digital video disk (DVD), or any suitable combination of the foregoing. In particular, a computer-readable storage medium includes computer-readable hardware such as a computer-readable storage device, e.g., memory. Here, a computer-readable storage device and computer-readable hardware are physical, tangible implementations that are non-transitory.

By non-transitory, it is meant that, unlike a transitory propagating signal per se, which will naturally cease to exist, the contents of the computer-readable storage device or computer-readable hardware that define the claimed subject matter persists until acted upon by an external action. For instance, program code loaded into random access memory (RAM) is deemed non-transitory in that the content will persist until acted upon, e.g., by removing power, by overwriting, deleting, modifying, etc.

Moreover, since hardware comprises physical element(s) or component(s) of a corresponding computer system, hardware does not encompass software, per se.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure.

Having thus described the disclosure of the present application in detail and by reference to embodiments thereof, it will be apparent that modifications and variations are possible without departing from the scope of the disclosure defined in the appended claims.

What is claimed is:

1. A method for processing a digital signal comprising:
   identifying a desired frequency and/or phase response that is represented in a frequency domain representation;
   constructing a fractional order control system that models the desired frequency and/or phase response by assembling at least one filter component from a filter component library to construct a fractional scaling digital filter to filter select frequencies of an input such that filtering comprises magnitude and phase modification of the input, where magnitude modification utilizes at least one filter component that is different from that used for phase modification, the filter component library comprising:

an integrator component;
a differentiator component;
a low-pass filter component;
a high pass filter component;
a high frequency amplifier component; and
a low frequency amplifier component;
wherein at least one filter component is defined by a Laplace function that includes a non-integer control order having a variable fractional scaling exponent;
receiving the input that is in the digital frequency domain;
processing the input based upon the fractional order control system to generate a digital output; and
conveying the generated digital output signal.

2. The method of claim 1, wherein:
constructing a fractional order control system comprises:
working step-wise in a single direction across the range of frequencies in the frequency domain representation, and for each change in the desired frequency and/or phase response, fitting at least one associated filter component from the filter component library to match the corresponding change in the desired frequency and/or phase response.

3. The method of claim 2 further comprising:
defining each one of the filter components in the filter component library to have a response that extends the entire range of frequencies in the frequency domain representation;
wherein:
working step-wise in a single direction across the range of frequencies in the frequency domain representation, further comprises:
selecting, for each change in the desired frequency and/or phase response, at least one filter component from the filter component library, such that the sum of the responses of all filter components constructed into the fractional order control system follow the changes across the frequency spectrum of the desired frequency and/or phase response.

4. The method of claim 1 further comprising:
receiving at least one parameter that is actively monitored to control a modification to the fractional order control system resulting in a change in at least one of the fractional scaling and phase shifting of the frequency content of the input.

5. The method of claim 1, wherein the filter component library further comprises a resonance filter component, and the method further comprises:
defining the integrator component having the form $$\frac{1}{s^{\beta/2}};$$

defining the differentiator component having the form $$\frac{1}{s^{-\beta/2}};$$

and
defining the resonance filter component having the form $$\left(\frac{k^2}{s^2 + 2dks + k^2}\right)_{\frac{\beta}{4}};$$

wherein: $\beta$ is a variable of the non-integer control order that represents the slope of a power spectrum associated with a corresponding section of the desired frequency response.

6. The method of claim 1 further comprising:
defining the low-pass filter component having the form $$\left(\frac{k}{s+k}\right)_{\frac{\beta}{2}};$$

defining the high pass filter component having the form $$\left(\frac{k}{s+k}\right)_{\frac{-\beta}{2}};$$

defining the high frequency amplifier component having the form $$\left(\frac{s+k}{k}\right)_{\frac{\beta}{2}};$$

and
defining the low frequency amplifier component having the form $$\left(\frac{s+k}{k}\right)_{\frac{-\beta}{2}};$$

wherein: $\beta$ is a variable of the non-integer control order that represents the slope of a power spectrum associated with a corresponding section of the desired frequency response; and
k represents gain.

7. The method of claim 1, wherein the filter component library further comprises a resonance filter component, and the method further comprises:
defining the integrator component in terms of:
magnitude $$M_{(\pm\omega)} = \frac{1}{\omega^{\frac{\beta}{2}}}$$

phase as:

$$\theta_{(+\omega)} = -\frac{\beta\pi}{4}$$

$$\theta_{(-\omega)} = \frac{\beta\pi}{4};$$

defining the differentiator component in terms of:
magnitude $$M_{(\pm\omega)} = \frac{1}{\omega^{\frac{-\beta}{2}}}$$

phase as:

$$\theta_{(+\omega)} = \frac{\beta\pi}{4}$$

$$\theta_{(-\omega)} = -\frac{\beta\pi}{4};$$

and
defining the resonance filter component in terms of:
magnitude $$M_{(\pm\omega)} = \sqrt{\frac{k^\beta}{\omega^\beta - 2k^{\frac{\beta}{2}}\omega^{\frac{\beta}{2}} + 4d^{\frac{\beta}{2}}k^{\frac{\beta}{2}}\omega^{\frac{\beta}{2}} + k^\beta}}$$

phase as:

$$\theta_{(+\omega)} = -\tan^{-1}\left(\frac{2d^{\frac{\beta}{4}}k^{\frac{\beta}{4}}\omega^{\frac{\beta}{4}}}{k^{\frac{\beta}{2}} - \omega^{\frac{\beta}{2}}}\right)$$

$$\theta_{(-\omega)} = \tan^{-1}\left(\frac{2d^{\frac{\beta}{4}}k^{\frac{\beta}{4}}\omega^{\frac{\beta}{4}}}{k^{\frac{\beta}{2}} - \omega^{\frac{\beta}{2}}}\right);$$

wherein: β a variable of is the non-integer control order that represents the slope of a power spectrum associated with a corresponding section of the desired frequency response;
ω is an angular frequency; and
k represents gain; and
d represents a damping coefficient.

8. The method of claim 1 further comprising:
defining the low-pass filter component in terms of:
magnitude $$M_{(\pm\omega)} = \sqrt{\frac{k^\beta}{\omega^\beta + k^\beta}}$$

phase as:

$$\theta_{(+\omega)} = -\tan^{-1}\left(\frac{\omega^{\frac{\beta}{2}}}{k^{\frac{\beta}{2}}}\right)$$

$$\theta_{(-\omega)} = \tan^{-1}\left(\frac{\omega^{\frac{\beta}{2}}}{k^{\frac{\beta}{2}}}\right);$$

defining the high pass filter component in terms of:
magnitude $$M_{(\pm\omega)} = \sqrt{\frac{k^{-\beta}}{\omega^{-\beta} + k^{-\beta}}}$$

phase as:

$$\theta_{(+\omega)} = -\tan^{-1}\left(\frac{\omega^{\frac{-\beta}{2}}}{k^{\frac{-\beta}{2}}}\right)$$

$$\theta_{(-\omega)} = \tan^{-1}\left(\frac{\omega^{\frac{-\beta}{2}}}{k^{\frac{-\beta}{2}}}\right);$$

defining the high frequency amplifier component in terms of:
magnitude $$M_{(\pm\omega)} = \sqrt{\frac{\omega^\beta + k^\beta}{k^\beta}}$$

phase as:

$$\theta_{(+\omega)} = \tan^{-1}\left(\frac{\omega^{\frac{\beta}{2}}}{k^{\frac{\beta}{2}}}\right)$$

$$\theta_{(-\omega)} = -\tan^{-1}\left(\frac{\omega^{\frac{\beta}{2}}}{k^{\frac{\beta}{2}}}\right);$$

and
defining the low frequency amplifier filter component in terms of:
magnitude $$M_{(\pm\omega)} = \sqrt{\frac{\omega^{-\beta} + k^{-\beta}}{k^{-\beta}}}$$

phase as:

$$\theta_{(+\omega)} = \tan^{-1}\left(\frac{\omega^{\frac{-\beta}{2}}}{k^{\frac{-\beta}{2}}}\right);$$

$$\theta_{(-\omega)} = -\tan^{-1}\left(\frac{\omega^{\frac{-\beta}{2}}}{k^{\frac{-\beta}{2}}}\right)$$

wherein: β is a variable of the non-integer control order that represents the slope of a power spectrum associated with a corresponding section of the desired frequency response;
ω is an angular frequency; and
k represents gain.

9. The method of claim 1, wherein:
the input is a select one of a digital image and video; and
the desired frequency and/or phase response is selected to implement a predetermined image processing function.

10. The method of claim 1, wherein the input is an analog signal that is converted to the digital frequency domain, and the desired frequency and/or phase response is selected to cause the output to represent a frequency filtered version of the input.

11. The method of claim 1, wherein:
identifying a desired frequency response further comprises identifying a desired frequency response to shape a noise;

constructing a fractional order control system further comprises constructing a fractional order control system to create a model of the desired frequency response to shape the noise;

receiving an input further comprises receiving the noise as an input;

processing the input based on the fractional order control system further comprises multiplying a frequency domain representation of the noise by the model of the desired frequency response to generate the digital output;

further comprising:
   processing the digital output by creating a copy of the digital output shifted by one-hundred-and-eighty degrees to generate an inverse digital output;
   embedding a payload signal into a select one of the digital output and the inverse digital output to create a transmission signal, designating the remaining one of the digital output and the inverse digital output as a key signal;
   conveying the key signal to a receiver; and
   sending the transmission signal to the receiver separate from the conveyance of the key signal to the receiver.

12. The method of claim 11 further comprising:
decoding the transmission signal by mixing the transmission signal and the key signal in synchronization.

* * * * *